United States Patent
Kato et al.

(10) Patent No.: US 7,704,812 B2
(45) Date of Patent: Apr. 27, 2010

(54) SEMICONDUCTOR CIRCUIT AND METHOD OF FABRICATING THE SAME

(75) Inventors: Kiyoshi Kato, Sagamihara (JP); Tomoaki Atsumi, Atsugi (JP); Atsuo Isobe, Atsugi (JP)

(73) Assignee: Semiconductor Energy Laboratory Co., Ltd., Atsugi-shi, Kanagawa-ken ( * ) Notice: Subject to any disclaimer, the term of this patent is extended or adjusted under 35 U.S.C. 154(b) by 591 days.

(21) Appl. No.: 11/607,021

(22) Filed: Dec. 1, 2006

(65) Prior Publication Data

US 2007/0099400 A1    May 3, 2007

Related U.S. Application Data

(62) Division of application No. 10/934,997, filed on Sep. 7, 2004, now Pat. No. 7,145,175, which is a division of application No. 10/395,202, filed on Mar. 25, 2003, now Pat. No. 6,930,326.

(30) Foreign Application Priority Data

Mar. 26, 2002    (JP) ............................. 2002-087208

(51) Int. Cl.
*H01L 21/00* (2006.01)
(52) U.S. Cl. ...................................... 438/166; 438/487
(58) Field of Classification Search ........................ None
See application file for complete search history.

(56) References Cited

U.S. PATENT DOCUMENTS 4,330,363 A    5/1982    Biegesen et al.

(Continued)

FOREIGN PATENT DOCUMENTS

EP    1 049 144    11/2000

(Continued)

OTHER PUBLICATIONS

M.W. Geis, et al., *Crystallographic Orientation of Silicon on an Amorphous Substrate Using an Artificial Surface-Relief Grating and Laser Crystallization*, 1979 American Institute of Physics, Appl. Phys. Lett. 35(1), Jul. 1, 1979, pp. 71-74.

(Continued)

*Primary Examiner*—David E Graybill
(74) *Attorney, Agent, or Firm*—Eric J. Robinson; Robinson Intellectual Property Law Office, P.C.

(57) ABSTRACT

According to the invention, a plurality of semiconductor devices which are required to have conformance are formed from crystalline semiconductor films having uniform crystallinity on the same line, and a semiconductor circuit in which variation between semiconductor devices is small can be provided, and a semiconductor integrated circuit having high conformance can be provided. The invention is characterized in that, in a part or whole of thin film transistors which configure an analog circuit such as a current mirror circuit, a differential amplifier circuit, or an operational amplifier, in which high conformance is required for semiconductor devices included therein, channel forming regions have crystalline semiconductor films on the same line. High conformance can be expected for an analog circuit which has the crystalline semiconductor films on the same line formed using the invention as the channel forming regions of the thin film transistors. That is, the invention is characterized in that, among the thin film transistors which configures the analog circuit, the channel forming regions of the thin film transistors having at least the same polarity are formed on the same line.

27 Claims, 18 Drawing Sheets
(1 of 18 Drawing Sheet(s) Filed in Color)

U.S. PATENT DOCUMENTS

| | | |
|---|---|---|
| 5,097,297 A | 3/1992 | Nakazawa |
| 5,163,220 A | 11/1992 | Zeto et al. |
| 5,432,122 A | 7/1995 | Chae |
| 5,636,042 A | 6/1997 | Nakamura et al. |
| 5,643,826 A | 7/1997 | Ohtani et al. |
| 5,747,828 A | 5/1998 | Hata et al. |
| 5,828,082 A | 10/1998 | Wu |
| 5,841,097 A | 11/1998 | Esaka et al. |
| 5,847,780 A | 12/1998 | Kim et al. |
| 5,854,803 A | 12/1998 | Yamazaki et al. |
| 5,858,823 A | 1/1999 | Yamazaki et al. |
| 5,893,730 A | 4/1999 | Yamazaki et al. |
| 5,932,893 A | 8/1999 | Miyanaga et al. |
| 5,953,597 A | 9/1999 | Kusumoto et al. |
| 5,965,915 A | 10/1999 | Yamazaki et al. |
| 5,981,974 A | 11/1999 | Makita |
| 5,986,306 A | 11/1999 | Nakajima et al. |
| 6,124,602 A | 9/2000 | Ohtani et al. |
| 6,204,520 B1 | 3/2001 | Ha et al. |
| 6,210,996 B1 | 4/2001 | Yamazaki et al. |
| 6,274,414 B1 | 8/2001 | Ogata et al. |
| 6,291,320 B1 | 9/2001 | Yamazaki et al. |
| 6,294,815 B1 | 9/2001 | Yamazaki et al. |
| 6,300,175 B1 | 10/2001 | Moon |
| 6,307,214 B1 | 10/2001 | Ohtani et al. |
| 6,323,072 B1 | 11/2001 | Yamazaki et al. |
| 6,326,249 B1 | 12/2001 | Yamazaki et al. |
| 6,331,718 B1 | 12/2001 | Yamazaki et al. |
| 6,355,940 B1 | 3/2002 | Koga et al. |
| 6,365,933 B1 | 4/2002 | Yamazaki et al. |
| 6,380,560 B1 | 4/2002 | Yamazaki et al. |
| 6,388,386 B1 | 5/2002 | Kunii et al. |
| 6,410,368 B1 | 6/2002 | Kawasaki et al. |
| 6,424,331 B1 | 7/2002 | Ozawa |
| 6,429,100 B2 | 8/2002 | Yoneda |
| 6,433,842 B1 | 8/2002 | Kaneko et al. |
| 6,475,840 B1 | 11/2002 | Miyanaga et al. |
| 6,492,659 B1 | 12/2002 | Yamazaki et al. |
| 6,512,246 B1 | 1/2003 | Tanabe |
| 6,528,397 B1 | 3/2003 | Taketomi et al. |
| 6,583,440 B2 | 6/2003 | Yasukawa |
| 6,632,696 B2 | 10/2003 | Kimura et al. |
| 6,677,611 B2 | 1/2004 | Yamazaki et al. |
| 2001/0035526 A1 | 11/2001 | Yamazaki et al. |
| 2002/0004292 A1 | 1/2002 | Yamazaki et al. |
| 2002/0048864 A1 | 4/2002 | Yamazaki et al. |
| 2002/0075208 A1 | 6/2002 | Bae et al. |
| 2002/0098628 A1 | 7/2002 | Hamada et al. |
| 2002/0134981 A1 | 9/2002 | Nakamura et al. |
| 2003/0001800 A1 | 1/2003 | Nakajima et al. |
| 2003/0128200 A1 | 7/2003 | Yumoto |
| 2003/0141505 A1 | 7/2003 | Isobe et al. |
| 2003/0141521 A1 | 7/2003 | Isobe et al. |
| 2003/0181043 A1 | 9/2003 | Tanada et al. |
| 2003/0183854 A1 | 10/2003 | Kato et al. |
| 2003/0183875 A1 | 10/2003 | Isobe et al. |
| 2003/0209710 A1 | 11/2003 | Yamazaki et al. |
| 2003/0218169 A1 | 11/2003 | Isobe et al. |
| 2003/0218170 A1 | 11/2003 | Yamazaki et al. |
| 2003/0218171 A1 | 11/2003 | Isobe et al. |
| 2003/0218177 A1 | 11/2003 | Yamazaki |
| 2003/0219935 A1 | 11/2003 | Miyairi et al. |
| 2003/0230749 A1 | 12/2003 | Isobe et al. |
| 2003/0230750 A1 | 12/2003 | Koyama et al. |
| 2004/0016958 A1 | 1/2004 | Kato et al. |
| 2004/0016967 A1 | 1/2004 | Yamazaki et al. |
| 2004/0026696 A1 | 2/2004 | Yamazaki et al. |
| 2004/0072411 A1 | 4/2004 | Azami et al. |
| 2004/0135174 A1 | 7/2004 | Yamazaki et al. |
| 2006/0267018 A1 | 11/2006 | Yamazaki et al. |

FOREIGN PATENT DOCUMENTS

| | | |
|---|---|---|
| JP | 59-184517 A | 10/1984 |
| JP | 62-104117 | 5/1987 |
| JP | 06-349735 | 12/1994 |
| JP | 07-130652 | 5/1995 |
| JP | 08-070129 | 3/1996 |
| JP | 08-195357 | 7/1996 |
| JP | 10-135468 | 5/1998 |
| JP | 10-135469 | 5/1998 |
| JP | 10-200112 A | 7/1998 |
| JP | 10-200114 A | 7/1998 |
| JP | 11-084418 | 3/1999 |
| JP | 11-354442 | 12/1999 |
| JP | 2000-068520 | 3/2000 |
| JP | 2000-349296 | 12/2000 |
| JP | 2001-011085 | 1/2001 |
| JP | 2001-144027 | 5/2001 |
| JP | 2002-014337 | 1/2002 |
| JP | 2002-313811 | 10/2002 |
| JP | 2002-324808 | 11/2002 |

OTHER PUBLICATIONS

M.W. Geis, et al., *Crystalline Silicon on Insulators by Graphoepitaxy*, IEEE 1979, pp. 210-212.

A. Hara et al., *Ultra-High Performance Poly-Si TFTs on a Glass by a Stable Scanning CW Laser Lateral Crystallization*, AM-LCD, 2001, pp. 227-230.

H. Smith et al., *Oriented Crystal Growth on Amorphous Substrates Using Artificial Surface-Relief Gratings[a)]*, Appl. Phys. Lett., vol. 32, No. 6, Mar. 15, 1978, pp. 349-350.

D.K. Biegelsen et al., *Laser-Induced Crystallization of Silicon Islands on Amorphous Substrates: Multilayer Structures*, Appl. Phys. Lett., vol. 38, No. 3, Feb. 1, 1981, pp. 150-152.

M.A. Baldo et al., *Very High-Efficiency Green Organic Light-Emitting Devices Based on Electrophosphorescence*, Applied Physics Letters, vol. 75, No. 1, Jul. 5, 1999, pp. 4-6.

H.W. Lam, *Characteristics of MOSFETS Fabricated in Laser-Recrystallized Polysilicon Islands with a Retaining Wall Structure on an Insulating Substrate*, IEEE Electron Device Letters, vol. EDL-1, No. 10, Oct. 1980, pp. 206-208.

M.W. Geis et al., *Grapho-Epitaxy of Silicon on Fused Silica Using Surface Micropatterns and Laser Crystallization*, J. Vac. Sci. Technol., vol. 16, No. 6, Nov./Dec. 1979, pp. 1640-1643.

T. Tsutsui et al., *High Quantum Efficiency in Organic Light-Emitting Devices with Iridium-Complex as a Triplet Emissive Center*, Jpn. J. Appl. Phys., vol. 38, Part 2, No. 12B, Dec. 15, 1999, pp. L1502-L1504.

M.A. Baldo, *Highly Efficient Phosphorescent Emission from Organic Electroluminescent Devices*, Nature, vol. 395, Sep. 10, 1998, pp. 151-154.

T. Tsutsui et al., *Electroluminescence in Organic Thin Films*, Photochemical Processes in Organized Molecular Systems, Proceedings of the Memorial Conference for the late Professor Shigeo Tazuke, Sep. 22-24, 1990, pp. 437-450.

M. Kishino et al., *Physics of VLSI Device*, Maruzen Co., Ltd., 1995, pp. 144-146.

T. Tsutsui et al., *Electroluminescence in Organic Thin Films*, Photochemical Processes in Organized Molecular Systems, Proceedings of the Memorial Conference for the late Professor Shigeo Tazuke, 1991, pp. 437-450.

Fig. 7A  d<a2, W1 and W2 are almost equal to 1μm or less.
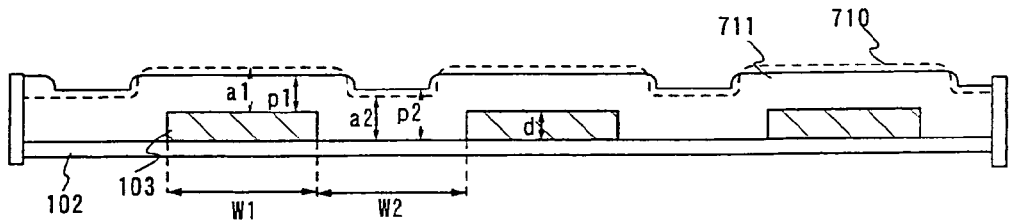
Fig. 7B  d≧a2, W1 and W2 are almost equal to 1μm or less.
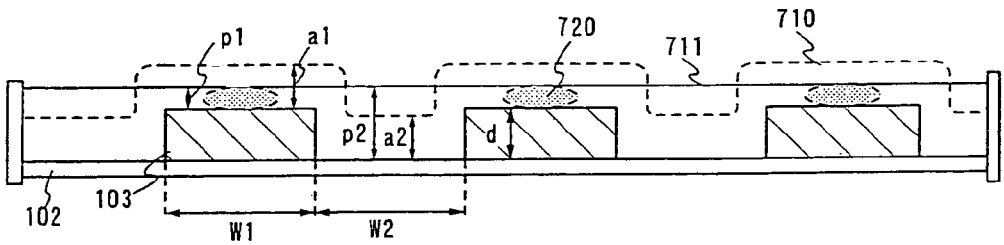
Fig. 7C  d>a2, W1 and W2 are almost equal to 1μm or less.
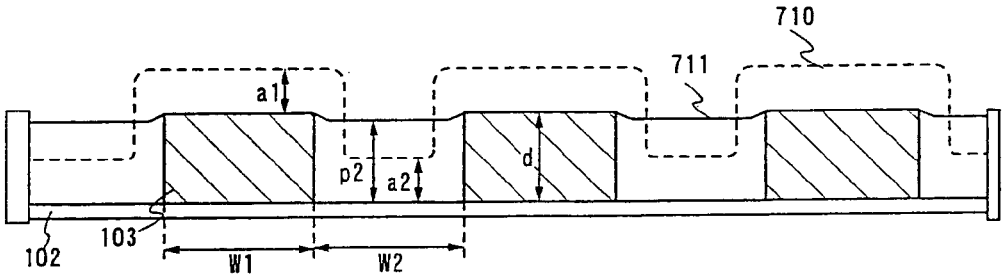
Fig. 7D  d≧a2, W1 and W2 are almost equal to 1μm or a little more.
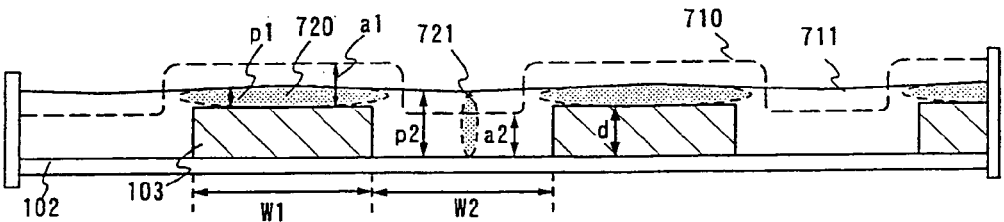
Fig. 7E  d≧a2, W1 and W2 are almost equal to 1μm or more.
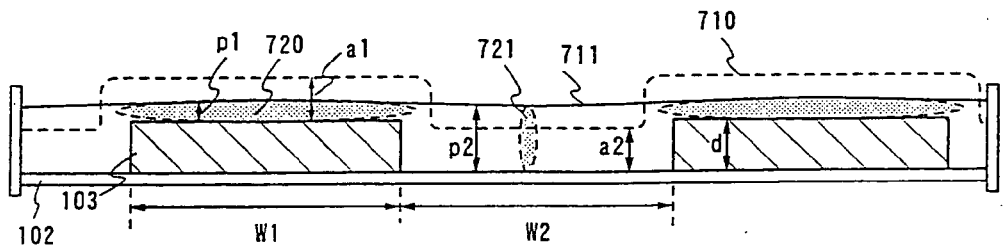

Fig. 13B center O

Fig. 13D energy density distribution along A—A' line

Fig. 14A-1
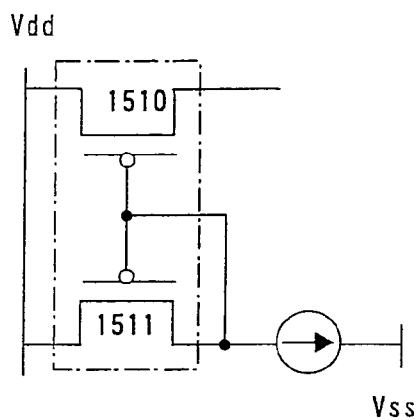
Fig. 14A-2
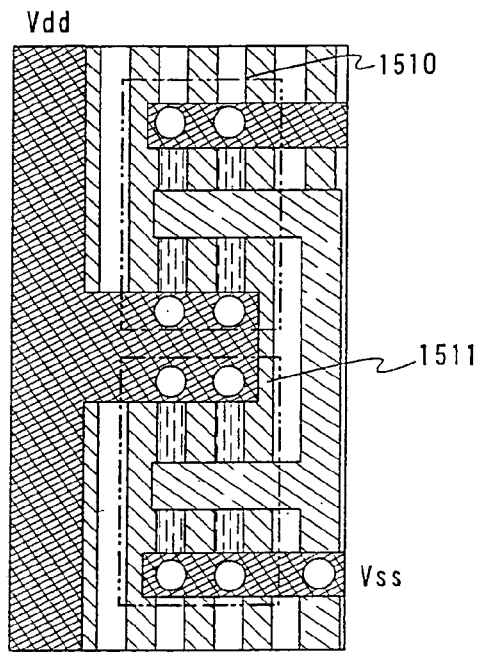
Fig. 14B-1
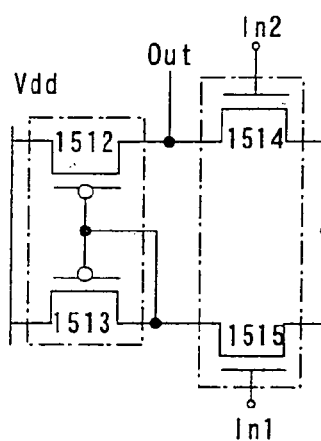
Fig. 14B-2
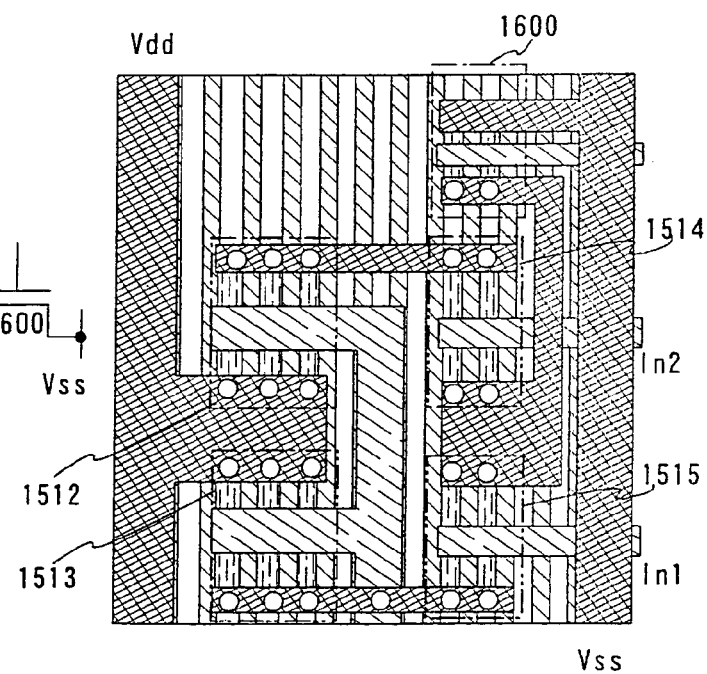
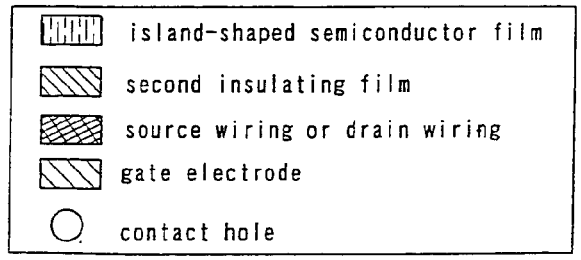

Fig. 15A
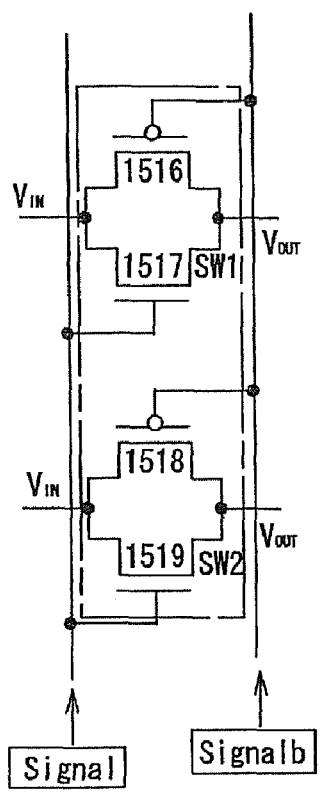
Fig. 15B
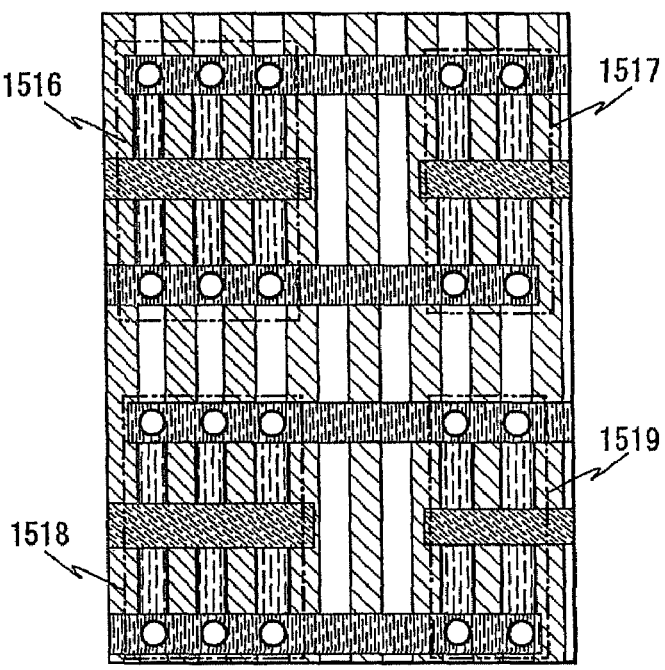
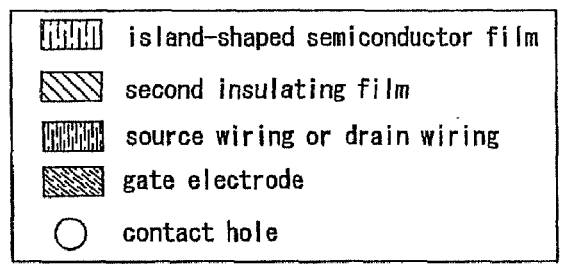

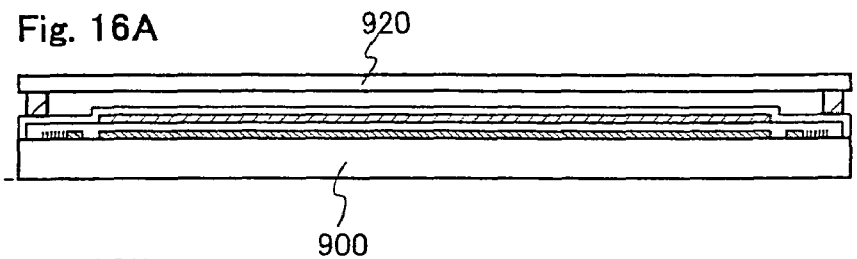
Fig. 16A
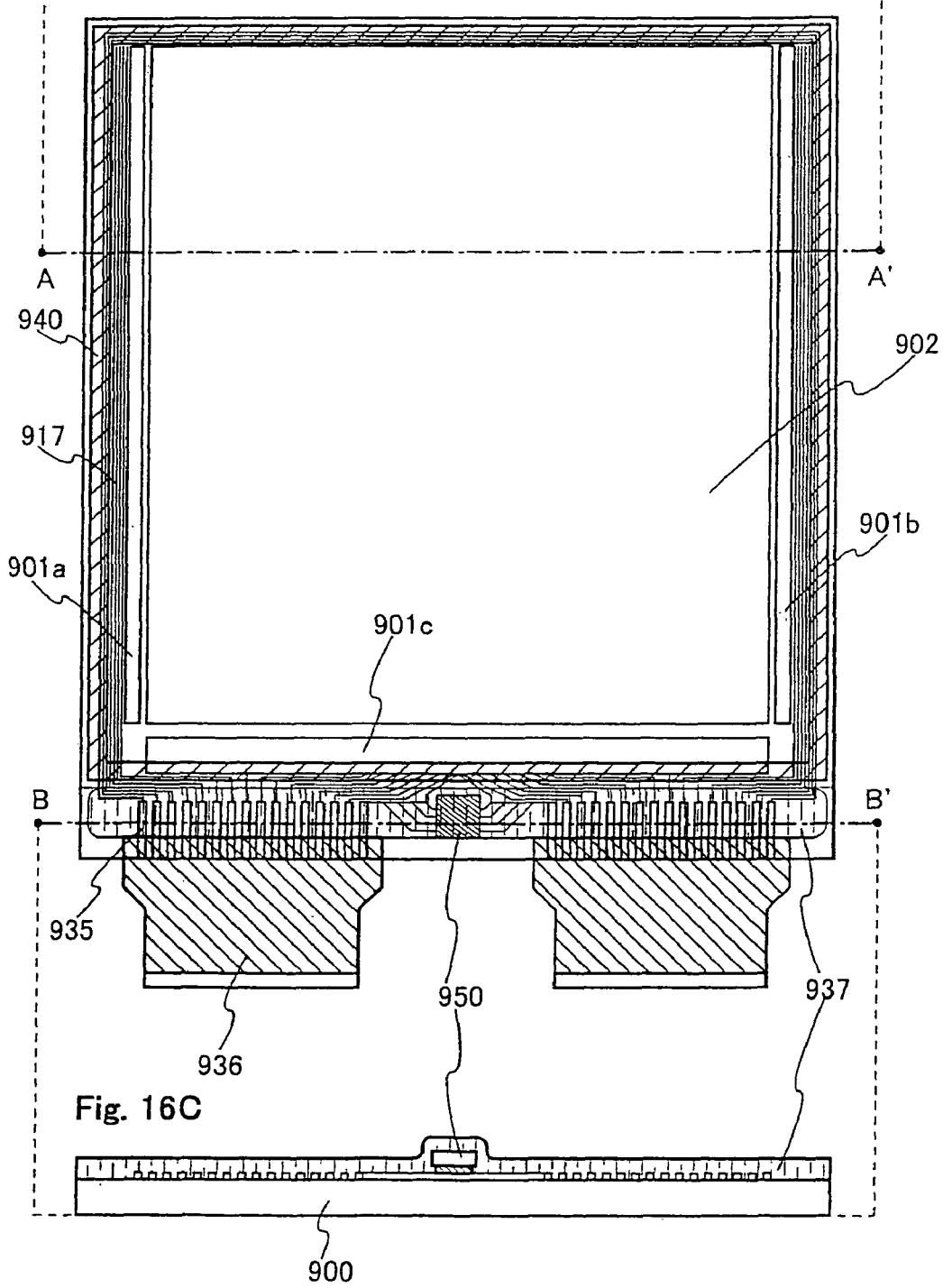
Fig. 16B
Fig. 16C sample: MA467#12
step: L/S=0.50/0.50um

SEMICONDUCTOR CIRCUIT AND METHOD OF FABRICATING THE SAME

BACKGROUND OF THE INVENTION

1. Field of the Invention

The present invention relates to a semiconductor device which is formed by using a semiconductor film having a crystal structure (also referred to as a crystalline semiconductor film) and a method for manufacturing the same, as well as a semiconductor integrated circuit comprising a circuit integrating the semiconductor devices and a method for manufacturing the same. Further, the present invention relates to a semiconductor device comprising a plurality of the semiconductor integrated circuits. And, the present invention especially relates to a semiconductor device included in a thin film transistor whose channel region is formed in a crystalline semiconductor formed on an insulating surface.

2. Description of the Related Art

A technique for forming a semiconductor device such as a thin film transistor and the like using a crystalline semiconductor film formed on an insulation substrate such as glass, has been developed. The thin film transistor formed by using the crystalline semiconductor film is integrated in a semiconductor integrated circuit, and the semiconductor integrated circuit is used in a flat panel display typified by a liquid crystal display device and an EL (electro luminescence) display device.

A current mirror circuit is a basic circuit of a semiconductor integrated circuit comprising a thin film transistor. The principle of the current mirror circuit is to have two thin film transistors with same electric characteristics. Such a circuit structure also can be given as an operational amplifier, a differential amplifier and the like.

As a method for forming a crystalline semiconductor film on an insulating substrate, a technique using laser beams to crystallize an amorphous semiconductor film has been developed. In a semiconductor manufacturing process, such as the technique for crystallizing an amorphous semiconductor film by using laser beams, a gas laser such as an excimer laser, and a solid laser such as a YAG laser are generally used as the laser beam source. An example for crystallizing an amorphous semiconductor film by laser beam irradiation is disclosed in JP-A-62-104117, in which is described a poly-crystallization of the amorphous semiconductor film by high-speed laser beam scan with the scanning speed set to more than 5000 times a diameter of the laser beam spot per second, without totally melting the amorphous semiconductor film. In addition, U.S. Pat. No. 4,330,363 discloses a technique to form a substantially single crystal region by irradiating an extended laser beam on an island-shaped semiconductor film. As another example, a method of irradiating a laser beam formed into a linear-like shape by an optical system, such as a laser processing apparatus, is disclosed in JP-A-8-195357.

Further, JP-A-2001-144027 discloses a technique such that crystalline semiconductor films with large grain size are formed by irradiating laser beams of a second harmonic onto the amorphous semiconductor films using solid laser oscillation apparatus such as Nd: $YVO_4$ laser. A transistor is thereby constituted.

However, when crystallization is made by irradiating the laser beams onto the amorphous semiconductor film, the crystal includes polycrystals which are formed at random and induce the formation of defects such as grain boundaries. Therefore, it becomes difficult to obtain uniform crystallinity and crystal orientations. As a result, current values may vary even when semiconductor devices of the same size are made and the same voltages are applied to the semiconductor devices.

Crystal defects such as grain boundaries result in carrier traps. This may be considered as a causative factor for mobility reduction of electrons or holes. Also, it is impossible to form a semiconductor film with neither distortion nor crystal defects due to factors such as a volume shrinkage of the semiconductor films, a thermal stress occurring between the semiconductor film and a base film, or a lattice mismatching which accompany crystallization. Consequently, the distortion and crystal defects are not only at the origin of inhomogeneous electrical characteristics of the semiconductor device, but are also the cause of inferior electrical characteristics of the semiconductor device.

Especially when crystalline semiconductor films are formed by using laser beams on a non-alkali glass substrate used abundantly and industrially, the focuses of the laser beams vary in response to the influence of the surge of the non-alkali glass substrate itself, causing undesired variations in the crystalline characteristics as a result. Furthermore, in order for a non-alkali glass substrate to avoid contamination by an alkaline metal, it is necessary to prepare protection films such as insulating films, as base films. Yet, it is almost impossible to form thereon crystalline semiconductor films free of grain boundaries and crystal defects.

The semiconductor integrated circuit and the like have semiconductor films formed on cheap glass substrates to constitute transistors, therefore, it is almost impossible to arrange transistors so as to avoid randomly located grain boundaries. That is, the grain boundaries or crystal defects hinder a strict control of the crystallinity of the channel forming regions of transistors. This is a causative factor of variation in the electrical characteristics of the semiconductor device, which make it difficult to form a circuit which requires high conformity (for example, a current mirror circuit).

SUMMARY OF THE INVENTION

In view of the above-mentioned problems, an object of the present invention is to provide a method to form a channel region of a transistor from a crystalline semiconductor film with uniform crystallinity.

Another object of the present invention is to form a plurality of semiconductor devices which require high conformity from crystalline semiconductor films with uniform crystallinity, and to provide a high-performance semiconductor integrated circuit incorporating semiconductor devices whose characteristics present small variations.

Still another object of the present invention is to provide a semiconductor circuit in which variations between pluralities of analog circuits are small (for example, analog switch circuits).

Further, by forming a crystalline semiconductor region free of grain boundaries at the location of a channel forming region of a transistor, yet another object of the present invention is to provide a semiconductor integrated circuit which is constituted by a semiconductor device or a group of semiconductor devices which are capable of high speed operations and has high current driving capability.

In order to solve the problems, the invention is characterized in that, on a substrate having an insulating surface, an insulating film with depressions and projections is formed, the depressions and projections being shaped as linear stripe-shaped patterns, an amorphous semiconductor film is formed on the insulating film, and the semiconductor film is melted and crystallized or recrystallized at a portion which corresponds to the depression of the insulating film (hereinafter, simply referred to as the depression) so that stripe-shaped crystalline semiconductor films are obtained. The invention is also characterized by the fact that a stripe-shaped crystalline semiconductor film is patterned so as to form an island-shaped semiconductor film including a channel forming region.

And, the invention is characterized in that, in some or in the totality of the thin film transistors part of a current mirror circuit, a differential amplifier circuit, or an operational amplifier circuit wherein high conformance is required in the semiconductor components, the channel forming regions are formed from a same stripe-shaped crystalline semiconductor film. Here, the high conformance means that the variation of the characteristics of the thin film transistors is reduced, i.e., that the conformance of characteristics of the thin film transistors is high.

Also, the invention is characterized in that, among the thin film transistors part of the analog circuit, at least the channel forming regions of the thin film transistors of the same polarity, or among the thin film transistors part of the analog circuit, at least the channel forming regions of the thin film transistors sharing a gate electrode (i.e., the thin film transistors electrically connected to the same gate electrode) are formed from a same stripe-shaped crystalline semiconductor film. Also the invention is characterized in that, in an analog circuit to which a plurality of input signals are applied, the channel forming regions of the thin film transistors of the same polarity connected to the gate electrodes to which the input signals are applied are formed on the same line.

Also, the invention is characterized in that a plurality of analog circuits disposed adjacently is formed from the island-shaped semiconductor films formed by patterning the crystalline semiconductor film of the same line. That is, the invention is characterized in that, in an analog switch or a source follower as a specific analog circuit, the channel forming regions of the thin film transistors of the neighboring circuits are formed from a same stripe-shaped crystalline semiconductor film.

For example, in case that a plurality of analog switches comprising n-channel type thin film transistors and p-channel type thin film transistors are provided, the channel forming regions of the n-channel type thin film transistor part of the analog switches are formed from a same stripe-shaped crystalline semiconductor film and the channel forming regions of the p-channel type thin film transistors are formed from a same stripe-shaped crystalline semiconductor film.

In this manner, the analog circuit of the invention, using channel forming regions of the thin film transistor made in a same stripe-shaped crystalline semiconductor film, are expected to have high performance characteristics.

Also, as means for recrystallizing the semiconductor film of the invention, a pulse oscillated or a continuous wave laser light irradiation is used, the light source being a gas laser oscillation apparatus or a solid laser oscillation apparatus. The laser beam is focused into a linear shape by an optical system, and its intensity distribution is such that the intensity can be considered as uniform along a long direction and can vary along a short direction. As the laser oscillation apparatus which is used as the light source, a rectangular beam solid laser oscillation apparatus is suitable, a slab laser oscillation apparatus being particularly appropriate. A solid laser oscillation apparatus using a rod doped with Nd, Tm, or Ho can be used as well. In particular, the rod may be constituted of YAG, $YVO_4$, YLF, $YAlO_3$ or the like and may be combined with a slab structure amplifier. As a slab material, a crystal such as Nd: YAG, Nd: GGG (Gadolinium Gallium Garnet), Nd: GSGG (Gallium Scandium Gadolinium Garnet) or the like is used. In the slab laser, light repeats total reflection and travels in a zigzag light path in this plate-shaped laser medium.

Also, an intense light having an energy density corresponding to that of a laser light may be used to perform the irradiation. To achieve a sufficient energy density, light emitted by a light source such as a halogen lamp, a xenon lamp, a high pressure mercury lamp, a metal halide lamp, an excimer lamp etc., may be focused by an optical system including lenses, mirrors and the like.

As the laser light or the strong light which is concentrated in a line shape and expanded in a long direction is irradiated to the semiconductor film, a position of laser light irradiation and a substrate on which the crystalline semiconductor film is formed move relatively, and the semiconductor film is melted by scanning a part or whole thereof by the laser light, and thereby crystallization or recrystallization is carried out. The scanning direction of the laser light is along a long direction of the depression formed in the insulating film and extending as a linear stripe pattern or a channel length direction of the transistor. By this, crystals are grown along the scanning direction of the laser light, and it is possible to prevent crystal grain boundaries from crossing the channel length direction.

The above-described depression may be formed by etching a thick film of silicon dioxide, silicon nitride, or silicon oxynitride. It is desirable that the depression be formed accordingly to the arrangement of the island-shaped semiconductor film including the channel forming regions of the semiconductor devices, in particular transistors, and formed in consistency with at least the channel forming regions. Also, it is desirable that the depression correspond to the channel length direction, and be formed with a width (channel width direction in case that the channel forming region is formed) of $0.01$ μm or more, and 2 μm or less (optimally 0.1-1 μm), and it is desirable that it be formed with a depth of 0.01 μm or more and 3 μm or less (optimally between 0.1 μm and 2 μm).

Also, the width of a channel forming region patterned so as to include a plurality of island-shaped crystalline semiconductor regions made from a plurality of the stripe-shaped crystalline semiconductor films is considered to be sum of widths of the plurality of the striped-shaped crystalline semiconductor films.

By setting the depth of the depression greater than or equal to the thickness of the semiconductor film, the semiconductor film which is melted by laser light or strong light irradiation flows and is solidified in the depression due to surface tension. As a result, the thickness of the semiconductor film located on the projection of the insulating film becomes thinner so that it is possible to localize mechanical stress and strain on it. Also, a side surface of the depression defines, to some extent, the crystal orientation.

In the insulating film on which the depressions and the projections of the invention are disposed, an angle formed by the side surface and the bottom surface of the depression (the side surface of the depression and the substrate) may be a right angle, but this angle can vary from the right angle according to forming conditions. Although, as described above, the side surface of the depression affects the crystal orientation definition to some degree, controlling the angle formed by the side surface of the depression and the substrate so as to form a taper does not cause any adverse effect.

As described above, the semiconductor film is melted by use of means such as the laser etc., flows in the depression formed on the insulating surface by the surface tension, and crystals are grown from the side surface portion of the depression so that the strains generated based upon the crystallization can be localized to an area other than the depression. That is, it is possible to obtain in the depression of an insulator film a crystalline semiconductor area free of strain (first crystalline semiconductor area). Also, on the portion of the insulating film corresponding to the projection, the crystalline semiconductor area includes crystal grain boundaries or crystal defects (second crystalline semiconductor area).

That is, since crystallinity of the crystalline semiconductor film formed on the projection is inferior as compared to the crystalline semiconductor film formed in the depression, it is desirable to avoid utilizing it as the channel forming region. However, the crystalline semiconductor film formed on the projection may be used positively as an electrode (in case of the thin film transistor, corresponds to a source electrode or a drain electrode) or for wiring. In case that it is used for wiring, since the degree of freedom to choose the way to use the surface is high, it is possible to design a resistance by adjusting the length of the wiring, or to give a function as a protection circuit by defining a shape other than a straight line.

As for the semiconductor film formed on the insulating film comprising the depressions and the projections, any one chosen among an amorphous semiconductor film, a polycrystalline semiconductor film (including one formed by a solid phase growth) or a microcrystalline semiconductor film formed by any method widely known in the art, is suitable. Typically, the amorphous silicon film is used, and besides that, an amorphous silicon germanium film, an amorphous silicon carbide film etc. can be used. In the silicon germanium film case, it is desirable that the atomic ratio of germanium in relation to silicon be between 0.01 and 2%.

And, a gate insulating film contacting the island shaped semiconductor film is formed, and further, a gate electrode is formed. On the occasion of this patterning, it is desirable for the island-shaped semiconductor film side walls to be tapered. After this, a field effect transistor can be formed by use of a well known technique.

According to the invention, on the insulating surface, and particularly in the case where the support substrate is made of an inexpensive glass substrate, the channel forming regions are formed from a same stripe-shaped crystalline semiconductor film so that variation between a plurality of semiconductor devices can be reduced, variation between semiconductor circuits (analog circuits) can be reduced, and thus, it is possible to provide a high-performance semiconductor integrated circuit. In addition, two or more of the above-mentioned semiconductor circuits comprising thin film transistors are combined to form a semiconductor integrated circuit requiring a high conformity of its components.

Also, since by designating an area in which the channel forming regions of the thin film transistors are formed it becomes possible to form a crystalline semiconductor area in which crystal grain boundaries do not exist, it is possible to provide a semiconductor integrated circuit formed by a semiconductor device or a group of semiconductor devices which are capable of high speed operations and in which current drive capability is high. Further, it is possible to provide a liquid crystal display apparatus having the semiconductor circuit of the invention, and a flat type display apparatus typified by an EL (electroluminescence) apparatus.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The invention, together with further advantages thereof, may best be understood by referring to the following description and the accompanying drawings in which:

FIGS. 7A, 7B, 7C, 7D, and 7E are sectional views explaining the relation between the aspect ratio and dimension of the depression and projections of the insulating layer, and the conformation of a crystalline semiconductor film;

FIGS. 13A, 13B, 13C, and 13D are views showing some characteristics of a laser light used in an embodiment of the invention;

FIGS. 14A-1, 14A-2, 14B-1, and 14B-2 are a circuit diagram and top views of a semiconductor device explaining an example in which the transistor of the invention is applied to a circuit;

FIGS. 15A and 15B are a circuit diagram and top views of a semiconductor device explaining an example in which the transistor of the invention is applied to a circuit;

FIGS. 16A to 16C are outline views showing one example of a semiconductor apparatus of the invention;

DESCRIPTION OF THE EMBODIMENTS

Embodiment 1

In this embodiment, a manner for fabricating a thin film transistor by carrying out the invention will be described. Also, two thin film transistors are represented on a same stripe in FIGS. 3 to 6, but the number of the thin film transistors to be formed may be determined appropriately by a person who carries out the invention, and any of the figures used does not give any limitations to the invention.

Figure 1A:
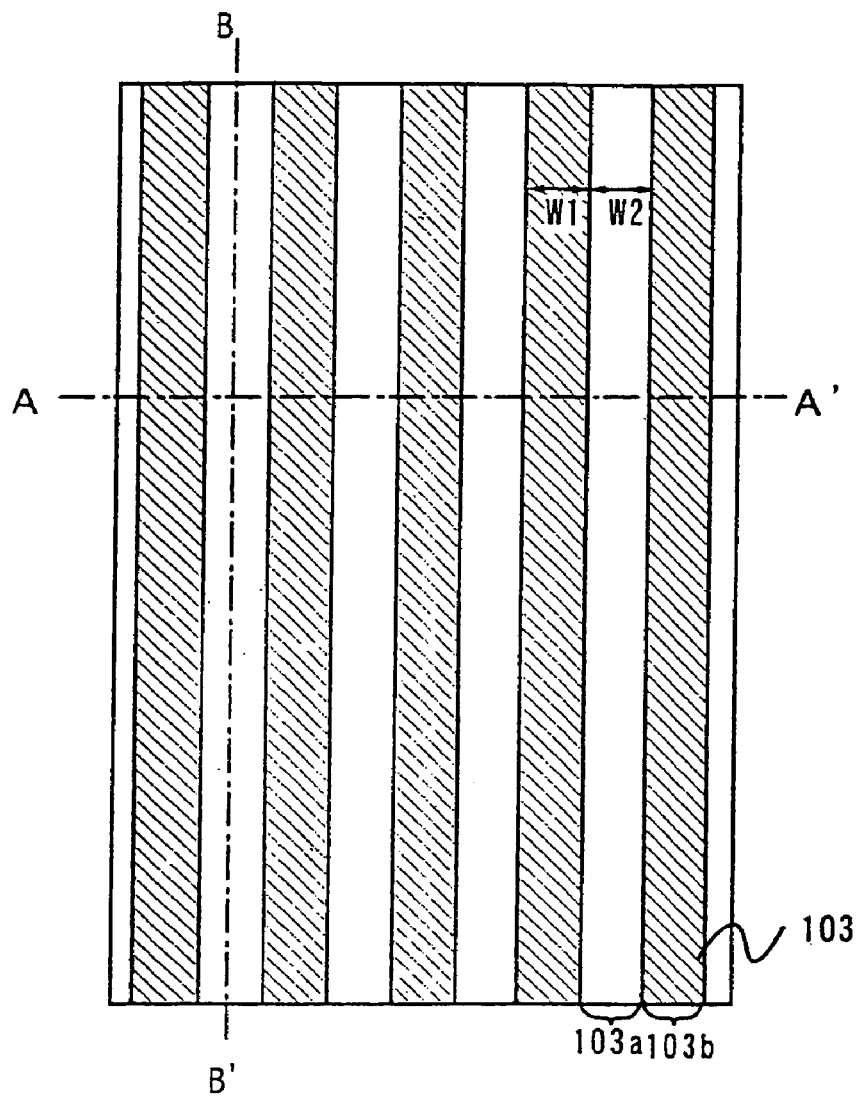
FIGS. 1A, 1B, and 1C are top and sectional views explaining a method of fabricating a transistor of the invention.
Figure 1B:
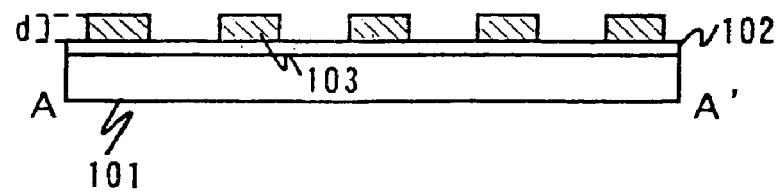
Figure 1C:
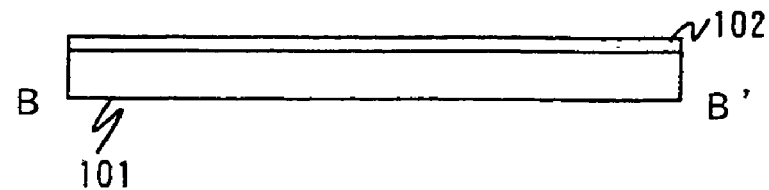

Firstly, FIGS. 1A to 1C will be described. FIG. 1A is a top view, and FIG. 1B is a sectional view corresponding to A-A'. It shows a situation in which, on a substrate 101, a first insulating film 102 and a second insulation film 103 which is formed in a linear stripe pattern are formed. In addition, in the embodiment, a depression designates a portion shown by 103a, and a projection designates a portion shown by 103b.

As the substrate 101, a commercially available non-alkali glass substrate, a quartz substrate, a sapphire substrate, a substrate which is formed by coating a surface of a monocrystalline or polycrystalline semiconductor substrate with an insulating film, and a substrate which is formed by coating a surface of a metal substrate with an insulating film can be used.

In order to form the linear stripe pattern with sub-micron design rule, it is desirable that concavity and convexity of a surface of a substrate, a vertical interval between the lowest part and the highest part of a surface of a substrate caused by surge or twist of the substrate is set to be less than the focal depth of a photolithography apparatus (in particular, a stepper). To be more precise, it is desirable that the vertical interval between the lowest part and the highest part of a surface of the substrate irradiated in a single light exposure step be 1 μm or less, and preferably 0.5 μm and less. At this stage, and particularly in the case of using a non-alkali glass substrate, it is recommended to be extremely cautious.

It is desirable that the width (W1) of the second insulating film 103 which is formed in the linear stripe pattern be of 0.1 to 10 μm (preferably 0.5 to 1 μm), that an interval (W2) between two adjacent stripes be of 0.01 to 2 μm (preferably 0.1 to 1 μm), and that a thickness (d) of the second insulating film be of 0.01 to 3 μm (preferably 0.1 to 2 μm). Also, there is no necessity to uniformly form or space the stripe patterns: they may be arranged with different intervals so as to comply with a geometry of an island-shaped semiconductor film. In addition, there is no particular numerical limitation concerning the length of a stripe pattern; and it is possible to form a stripe pattern with a length such as to cross the substrate from one end to the other end as shown in FIG. 1, and it is possible to have a length such that a channel forming region of a transistor can be formed as described later in Embodiment 2.

The first insulating film 102 may be formed by a material having an etching rate lower than that of a second insulating film which will be formed later, and may be formed typically by a material selected from a group of materials comprising silicon nitride, silicon oxide, silicon oxynitride (indicated as SiOxNy), silicon nitride-oxide (indicated as SiNxOy), aluminum nitride (indicated as AlxNy), aluminum oxynitride (indicated as AlOxNy), aluminum nitride-oxide (indicated as AlNxOy), and aluminum oxide, with a thickness of 30-300 nm. In particular, since an aluminum oxide film can be expected to have a blocking effect to sodium (Na), it is useful as a measure for preventing the glass substrate from being polluted.

In addition, a silicon oxynitride (SiOxNy) film may contain 25-35 atom % of silicon, 55-65 atom % of oxygen, 1-20 atom % of nitrogen, and 0.1-10 atom % of hydrogen. Also, a silicon nitride-oxide (SiNxOy) film may contain 25-35 atom % of silicon, 15-30 atom % of oxygen, 20-35 atom % of nitrogen, and 15-25 atom % of hydrogen. Also, an aluminum oxynitride (AlOxNy) film may contain 30-40 atom % of aluminum, 50-70 atom % of oxygen, and 1-20 atom % of oxygen. Also, an aluminum nitride-oxide (AlNxOy) film may contain 30-50 atom % of aluminum, 0.01-20 atom % of oxygen, and 30-50 atom % of nitrogen.

The second insulating film 103 may be formed by silicon oxide or silicon oxynitride and have a thickness of 10-3000 nm, preferably 100-2000 nm. The silicon oxide can be formed by plasma CVD using mixed tetraethyl orthosilicate (TEOS) and $O_2$. The silicon nitride-oxide film can be formed by plasma CVD using $SiH_4$, $NH_3$ and $N_2O$ or $SiH_4$ and $N_2O$ as raw materials.

In addition, it is preferable to form the second insulating film 103 by CVD (typically, plasma CVD or thermal CVD) or PVD (typically, sputtering method). The reason is that, by using relatively soft materials as a base to the amorphous semiconductor film, the accumulation of stress in the semiconductor film during its crystallization can be limited, and this is considered to be an important point to obtain a good crystallinity in the semiconductor film.

As shown in FIG. 1, in the case that the linear stripe pattern is formed by two layers of insulating films, it is necessary that the first insulating film 102 and the second insulating film 103 have different etching ratios during an etching process. In a practical sense, it is desirable to adjust appropriately materials and film forming conditions such that etching speed of the second insulating film 103 becomes relatively faster than that of the first insulating film 102. The etching process is carried out by wet etching, using a solution of buffered hydrofluoric acid, or by dry etching, using $CHF_3$ gas, the areas which will become the projections of the second insulating film being protected by a mask.

It is desirable to set a depth (corresponding to the height d of a step of FIG. 1B) of the depression formed in the second insulating film 103, and thus the thickness of the semiconductor film 103, according to a desired semiconductor film thickness of a channel forming region in the depression, taking into account that the semiconductor film thickness of the channel forming region should be similar to or smaller than the depth of the depression.

Also, next, a relation between the step d of the second insulating film 103 and the film thickness of the semiconductor film in the depression 103a will be described.

FIG. 7 shows conceptual views disclosing the results of an experiment conducted by the inventors and concerning the crystallization process mentioned previously. FIGS. 7A to 7E show the first insulating film 102 and the projections of the second insulating film 103, and the crystallization pattern in relation with the depth of the depression 103a, the interval between two projections, the step d, and the thickness of the amorphous semiconductor layer.

The lengths recited in FIG. 7 are defined as follows: a1 denotes the thickness of an amorphous semiconductor film 710 on the second insulating film (on the projection), a2 denotes the thickness of the amorphous semiconductor film 710 in the depression, p1 denotes the thickness of a crystalline semiconductor film 711 on the second insulating film (on the projection), p2 denotes the thickness of the crystalline semiconductor film 711 in the depression, d denotes the thickness of the second insulating film (depth of the depression, i.e., the step), W1 denotes the width of the second insulating film (width of the projection), W2 denotes the width of the depression (interval between two adjacent projections). In addition, FIG. 7, like FIG. 1, shows the first insulating film 102 and the second insulating film 103.

FIG. 7A represents a case where d<a2, and W1 and W2 are equal to or smaller than 1 μm, i.e. the case where the depth of the depression is smaller than the thickness of the amorphous semiconductor film 710 in the depression. In such a case, the surface of the crystalline semiconductor film 711 could not be flattened, even through processes of melting and crystallization. In other words, the surface of the crystalline semiconductor 711 reflects the presence of the underlying depressions and reflections of the base film (in particular the second insulating film).

FIG. 7B represents a case where d≧a2, and W1 and W2 are smaller than or equal to 1 μm, i.e. the case where the depth of the depression is larger than the thickness of the amorphous semiconductor film. In such a case, the surface tension makes the melted semiconductor film flow into the depression. As a result, the solidified semiconductor film presents a flattened surface, as shown in FIG. 7B. In this case, the thickness of the semiconductor film over the projections is smaller than the thickness of the semiconductor film over the depressions (p1<p2), stress and strain are concentrated in a region 720 over the projections, and crystal grain boundaries are formed in a region 720.

FIG. 7C represents a case where d>a2, and W1 and W2 are smaller than or equal to 1 μm. In that case, the crystalline semiconductor 711 fills the depression, and may almost not remain on the projections.

FIG. 7D represents a case where d≧a2, and W1 and W2 are slightly greater than or equal to 1 μm. In comparison with the previous cases, the depression is broadened. The depression is filled with the crystalline semiconductor film so that there is effectively planarization, but a crystal grain boundary is likely to be created in the vicinity 721 of a center of a depression. Indeed, it is estimated that the broadening of the interval W2 hinders the relaxation of stress, so that stress and strain accumulate in the vicinity 721 as the stress accumulates in the region 720.

FIG. 7D represents a case where d≧a2, and W1 and W2 are slightly greater than or equal to 1 μm. In that case, the situation shown in FIG. 7D is amplified.

In order to make the above-mentioned semiconductor device, and particularly to form the channel forming region of a transistor, the conditions described in FIG. 7B are considered to be optimal. In addition, it should be emphasized that even though the depressions and projections shaped by using a first insulating film and a second insulating film are described, the present invention is not limited to this example and another way to obtain a similar shape may be used. For example, applying an etching process to the surface of a quartz surface may allow one to directly obtain a pattern comprising depressions and projections.

Figure 2A:
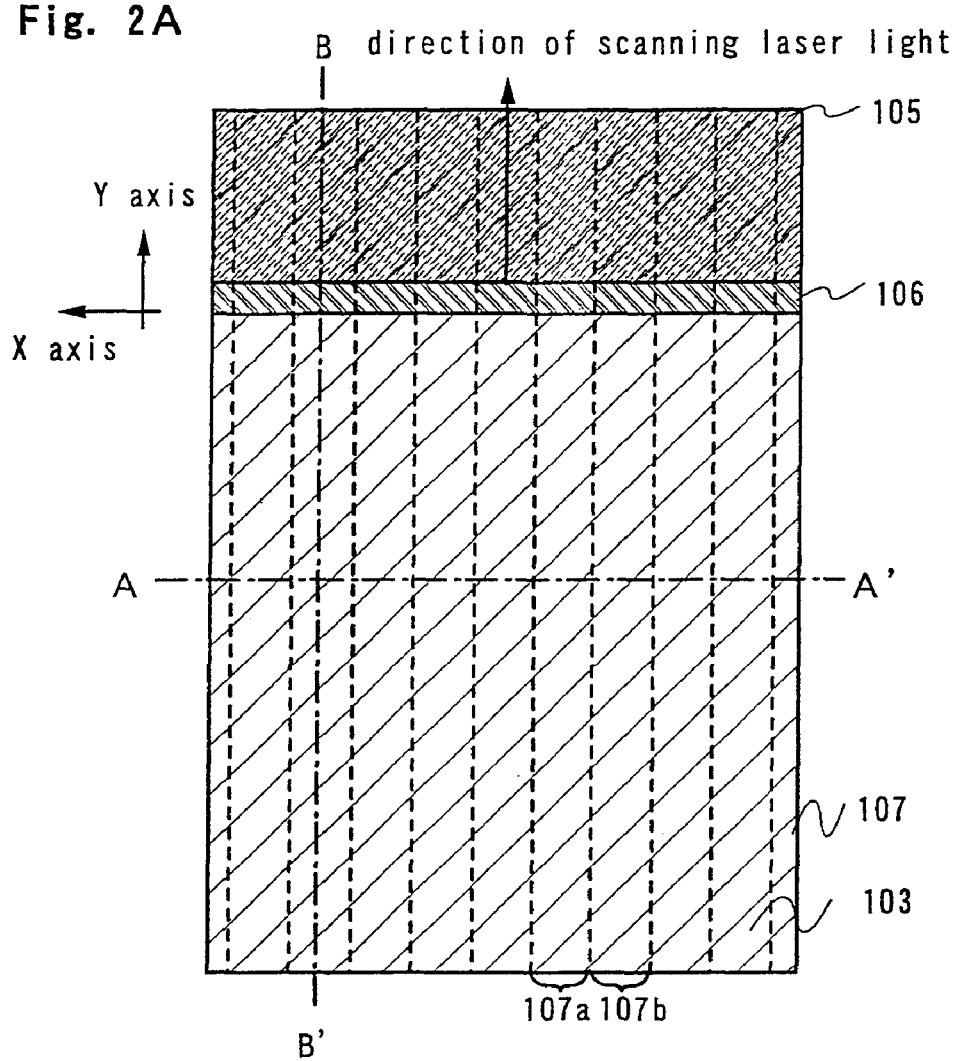
FIGS. 2A, 2B, and 2C are top and sectional views explaining the method of fabricating the transistor of the invention.
Figure 2B:
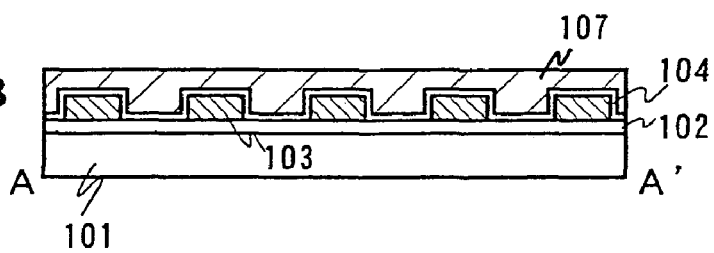
Figure 2C:
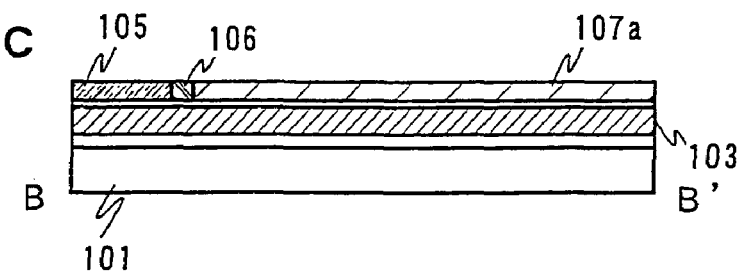

Next, a laser irradiation step will be described by using FIGS. 2A to 2C. FIG. 2A is a top view, FIG. 2B is a sectional view corresponding to A-A', and FIG. 2C is a sectional view corresponding to B-B'. They show an amorphous semiconductor film 105 formed so as to cover a second insulating film 103. The crystallization of the amorphous semiconductor film is carried out by a continuous wave laser source having a line-shaped laser beam.

Firstly, an insulating film 104 which functions as a buffer (hereinafter, referred to as a buffer film) is formed so as to cover surfaces comprising the first insulating film 102 and the second insulating film 103 and depressions 103a. Thereafter, the amorphous semiconductor film 105 is continuously formed so as to have a thickness of 0.01-3 μm (preferably, 0.1-1 μm) without exposure to the atmosphere. The buffer film 104 is aimed at eliminating the influence of chemical pollution such as boron which is attached to the surfaces of the first insulating film 102 and the second insulating film 103, and at improvement of adhesion, and even a thin buffer film provides substantial benefits. Typically, the buffer film may be 5 to 50 nm thick (preferably 20 nm or more in order to improve blocking effect of the chemical pollution).

Then, the amorphous semiconductor film 105 is melted instantaneously and crystallized. This crystallization is carried out by a process in which an optical apparatus focuses the light of a laser beam, or another strong light source like a lamp, in a way such that a concentration of light energy irradiating the semiconductor layer melts the semiconductor layer. In this process, in particular, it is desirable to use a laser light generated by a continuous wave laser oscillation apparatus. The laser light used is concentrated in a line shape by the optical system and expanded in a major axis direction, and it is desirable that its intensity distribution have a uniform area in the major axis direction. Also, some degree of distribution in a minor axis direction is acceptable.

As one example of a condition of crystallization, an $YVO_4$ laser oscillator of continuous oscillation mode is used. An output of 5-10 W of its second harmonic (wavelength: 532 nm) is concentrated to form a line shaped laser beam in which a ratio of a long direction to a short direction is 10 or more, and concentrated so as to have uniform energy density distribution in the long direction. The laser beam is scanned over the amorphous semiconductor film at a speed of 5-200 cm/sec. In addition, the uniform energy density distribution is not necessarily completely constant, and the energy density distribution may vary within a scope of ±10%.

Also, the crystallization by the laser light which is concentrated in a line shape may be completed by only one time scanning (i.e., one direction), or by reciprocating scanning in order to further improve the crystallinity. According to need, the laser light which is concentrated in the line shape may be scanned in a zigzag manner. Further, after the crystallization is carried out by the laser light, oxide may be removed by hydrofluoric acid etc., or a surface of a silicon film may be processed by alkaline solution such as ammonia hydrogen peroxide aqueous solution, and a portion with fast etching speed and bad quality may be selectively removed, and similar crystallization processing (re-crystallization) may be carried out again.

As the laser oscillation apparatus, a rectangular beam solid laser oscillation apparatus is used and, in particular, preferably, a slab laser oscillation apparatus is used. As a slab material, a crystal such as Nd: YAG, Nd: GGG (Gadolinium Gallium Garnet), Nd: GSGG (Gallium Scandium Gadolinium Garnet), etc. is used. In the slab laser, light repeats total reflection and travels in a zigzag light path in the slab, a plate-shaped laser medium. The laser oscillation apparatus may also be a solid laser oscillation apparatus using a rod doped with Nd, Tm, or Ho, and in particular, it may be one in which the rod is made of a crystal such as YAG, $YVO_4$, YLF, $YAlO_3$ or the like. The solid laser oscillation apparatus using a rod may be combined with a slab structure amplifier.

And, as shown in FIG. 2A by an arrow, the line shaped laser light or strong light is scanned so as to scan an irradiation area 106 of the line-shaped laser light beam (in the figure, line shaped along the X axis direction) along the Y direction, so as to irradiate each of the second insulating films 103 which form the linear stripe patterns. In addition, here, the "line shaped laser light beam" means one in which a ratio of a dimension of a section of the laser light beam in the major axis direction (in the figure, X axis direction) over a dimension of a section of the laser light beam in the minor axis direction (in the figure, Y axis direction) is 10:1 or more. Also, although only a part thereof is shown in FIG. 2, an end part of the irradiation area 106 of the line-shaped laser light may be a rectangular shape or a shape having curvature.

Also, it is desirable that the wavelength of the continuous wave laser light be 400-700 nm, taking light absorption coefficient of the amorphous semiconductor film into consideration. Light having a wavelength in this range is obtained by picking up a second harmonic and a third harmonic of a fundamental wave by use of a wavelength conversion device. As the wavelength conversion medium, materials such as ADP (ammonium dihydrogen phosphate), $Ba_2NaNb_5O_{15}$ (barium sodium niobate), CdSe (cadmium selenide), KDP (potassium dihydrogen phosphate), $LiNbO_3$ (lithium niobate), Se, Te, LBO, BBO, $KB_5$ or the like are used. In particular, it is desirable to use LBO. In one typical example, a second harmonic (532 nm) of Nd: YVO$_4$ laser oscillation apparatus (with a fundamental harmonic wavelength of 1064 nm) is used. Also, as an oscillation mode of the laser, a single mode which is TEM$_{00}$ mode is used.

In a case where silicon is selected as an appropriate material to form the amorphous semiconductor film, a light spectrum region where an absorption coefficient of the semiconductor film is of $10^3$-$10^4$ cm$^{-1}$ falls within a visible light spectrum region. In case that a substrate such as glass having high visible light transmittance and an amorphous semiconductor film including silicon with thickness of 30-200 nm are crystallized, by irradiating light in the visible light area of wavelength 400-700 nm, the semiconductor film is selectively heated, and the crystallization can be carried out without giving any damages to a base insulating film. To be more precise, length of invasion of light of wavelength 532 nm is roughly 100 nm-1000 nm to the amorphous silicon film, and it is possible to sufficiently reach inside of the amorphous semiconductor film 105 which is formed with thickness 30 nm-200 nm. That is, it is possible to heat the semiconductor film from its inside, and it is possible to uniformly heat almost entire semiconductor film in the irradiation area of the laser light.

The laser beam is scanned in a direction which is parallel to the long direction of the linear stripe patterns, and dissolved semiconductor flows into the depressions due to its surface tension and solidifies. In the solidified situation, as shown in FIG. 2B, the surface is substantially flattened. This is because, once the semiconductor is melted, regardless of the location of the semiconductor, the interface between the melted semiconductor and a vapor phase reaches an equilibrium and a flat interface is formed. Further, a crystal growth end and a crystal grain boundary are formed on the second insulating film (on the projection). By this means, the crystalline semiconductor film 107 is formed. In addition, 107*a* designates a semiconductor area which is formed in the depression and has high crystallinity (first crystalline semiconductor area), and 107*b* designates a crystalline semiconductor area (second crystalline semiconductor area) which is formed on the projection and has inferior crystallinity.

In addition, on the occasion of the above-described crystallization process, if the second insulating film is a soft insulating film (insulating film with low density), one can expect that stress due to shrinkage etc. of the semiconductor film at the time of crystallization is relaxed. On the other hand, if the second insulating film is a hard insulating film (insulating film with high density), this film will tend to resist to the expansion or contraction of the semiconductor film, and stress-strain etc. are susceptible to remain in the semiconductor film after crystallization, which may become a cause of crystal defects. For example, in a well known graphoepitaxy technology ("M. W. Geis, D. C. Flanders, H. I. Smith: Appl. Phys. Lett. 35 (1979) pp 71"), depressions and projections are directly formed on a hard quartz substrate and in this case, it is impossible to relax thermal shrinkage and stress occurring during the crystallization, and defects or dislocations caused by strain or stress may be formed.

However, the Applicant does take those points into consideration, and in the case where the depressions and the projections are formed on an inexpensive glass substrate, a soft insulating film formed by CVD or PVD, softer than quartz glass, is used for the second insulating film which becomes the base film, thereby directed to the relaxation of stress formation during the crystallization of the semiconductor film, and on that point, this invention and the above-described well known graphoepitaxy technique differ essentially with each other.

In addition, an insulating film which is softer than quartz glass means, for example, an insulating film whose etching rate is higher than that of quartz glass (quartz glass which is industrially utilized as a substrate) under identical measurement conditions, or an insulating film whose hardness is lower under the same measurement conditions. With regard to the etching rate and the hardness, relative values in comparison to the quartz substrate should be considered, and absolute value of the etching rate is not an important factor. Thus, the measurement conditions of the etching rate and the hardness can be freely chosen.

For example, if a silicon oxynitride film is used as the second insulating film, the silicon oxynitride film is preferably formed by plasma CVD using SiH$_4$ gas and N$_2$O gas as source materials. The silicon oxynitride film has an etching rate of 110-130 nm/min (90-100 nm/min after thermal treatments of 1 hour at 500° C. followed by 4 hours at 550° C.) at 20° C. in a mixed aqueous solution composed of 7.13% of ammonium hydrogen fluoride (NH$_4$HF$_2$) and 15.4% ammonium fluoride (NH$_4$F).

Also, if a silicon nitride-oxide film is used as the second insulating film, a silicon nitride-oxide film is preferably formed by plasma CVD using SiH$_4$ gas, NH$_3$ gas, and N$_2$O gas as source materials. The silicon nitride-oxide film has an etching rate of 60-70 nm/min (40-50 nm/min after thermal treatments of 1 hour at 500° C. followed by 4 hours at 550° C.) at 20° C. in a mixed aqueous solution composed of 7.13% of ammonium hydrogen fluoride (NH$_4$HF$_2$) and 15.4% ammonium fluoride (NH$_4$F).

As described above, an insulating film is formed so as to comprise depressions and projections and so as to present a linear stripe pattern. Then, an amorphous semiconductor film is deposited on the insulating film, and is crystallized by a laser light irradiation. Due to the melting condition induced by the irradiation, the semiconductor film flows into the depressions and is solidified. It is possible to concentrate strain or stress induced by the crystallization in areas other than the depressions, and it becomes possible to selectively form an area with bad crystallinity, i.e. having defects such as crystal grain boundary. A feature of the present invention is that a semiconductor area with good crystallinity is used to form parts of a thin film semiconductor, such as a channel region, taking advantage of the high carrier mobility characteristics of regions having a good crystallinity. Next, a heat treatment of preferably, 500-600° C. is carried out to suppress the strain stored in the crystalline semiconductor film. This strain is generated by volume shrinkage of semiconductor which occurs during the crystallization, or originates from thermal stress and lattice misfit with the base, and so on. This heat treatment may be carried out by use of a normal thermal treatment apparatus, and for example, a treatment of 1-10 minutes may be carried out by use of a rapid thermal annealing (RTA) method with a gas heating system. Note that this process is not an essential requirement in this invention, and is to be applied appropriately.

Figure 3A:
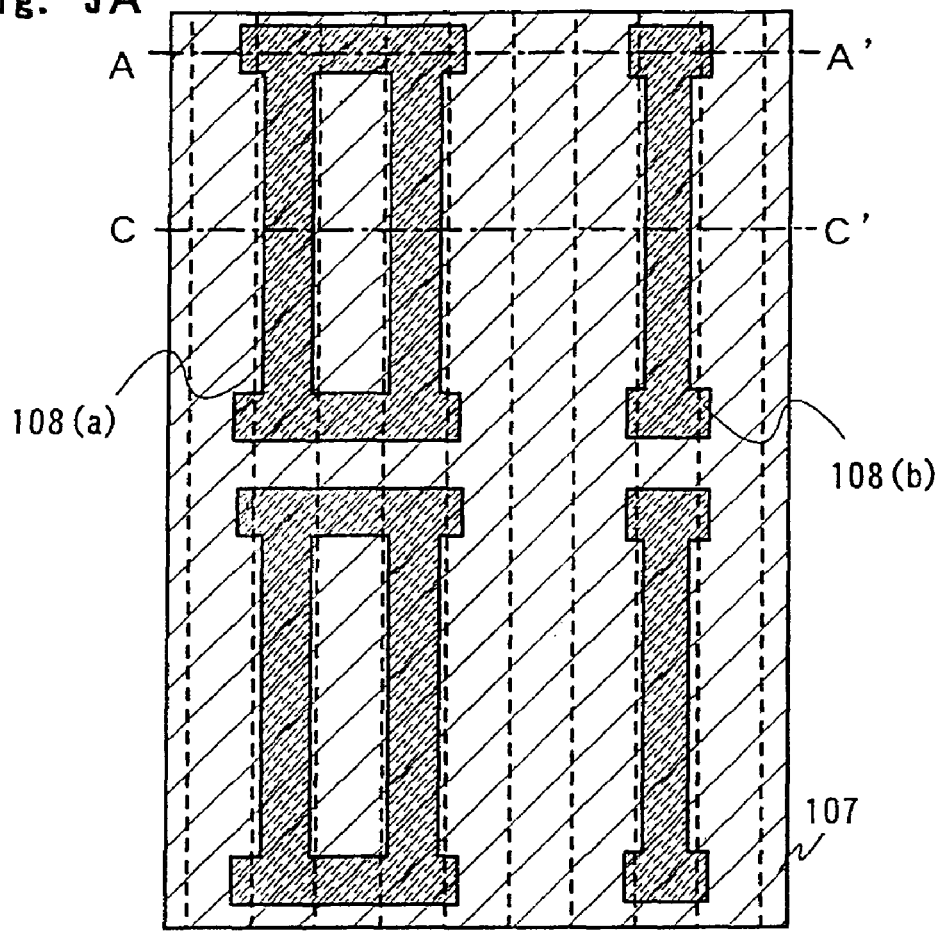
FIGS. 3A, 3B, and 3C are top and sectional views explaining the method of fabricating the transistor of the invention.
Figure 3B:
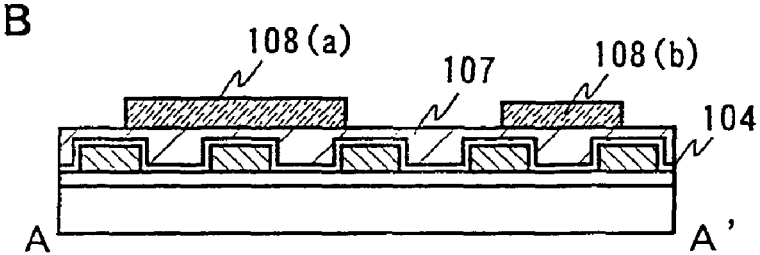
Figure 3C:
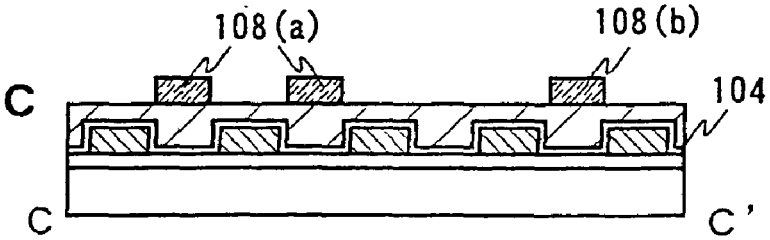

Next, FIG. 3 will be described. FIG. 3A is a top view, FIG. 3B is a sectional view corresponding to A-A', and FIG. 3C is a sectional view corresponding to C-C'. They represent a situation where a pattern is applied on the crystalline semiconductor film 107 to clearly define island-shaped semiconductor areas of a thin film transistor.

In FIG. 3A, resist masks 108(*a*) and 108(*b*) are disposed so as to cover parts of the depressions and the projections of the second insulating film 103. Indeed, even if the crystalline semiconductor film which is formed on the projection of the second insulating film 103 has inferior crystallinity, no serious problem is caused as long as it is not used as a channel forming region but as an electrode. That is, by actively using the crystalline semiconductor film which is formed on the projection as a source region and a drain region of the thin film transistor, it is possible to keep a margin for the design of a contact with an electrode with each region of the source region and the drain region (a source electrode or a drain electrode). The pattern of a resist mask may be designed accordingly, as in the case of the embodiment of FIG. 3 which shows 108(a) and 108(b) as examples of mask patterns.

Also, taking deviation of the resist masks into consideration, after first resist masks are disposed on a source region and a drain region, the surface of the crystalline semiconductor film 107 may be etched out, and the island-shaped semiconductor film may be formed by use of a second resist mask as shown in FIG. 3. This will be described in embodiment 3.

Figure 4A:
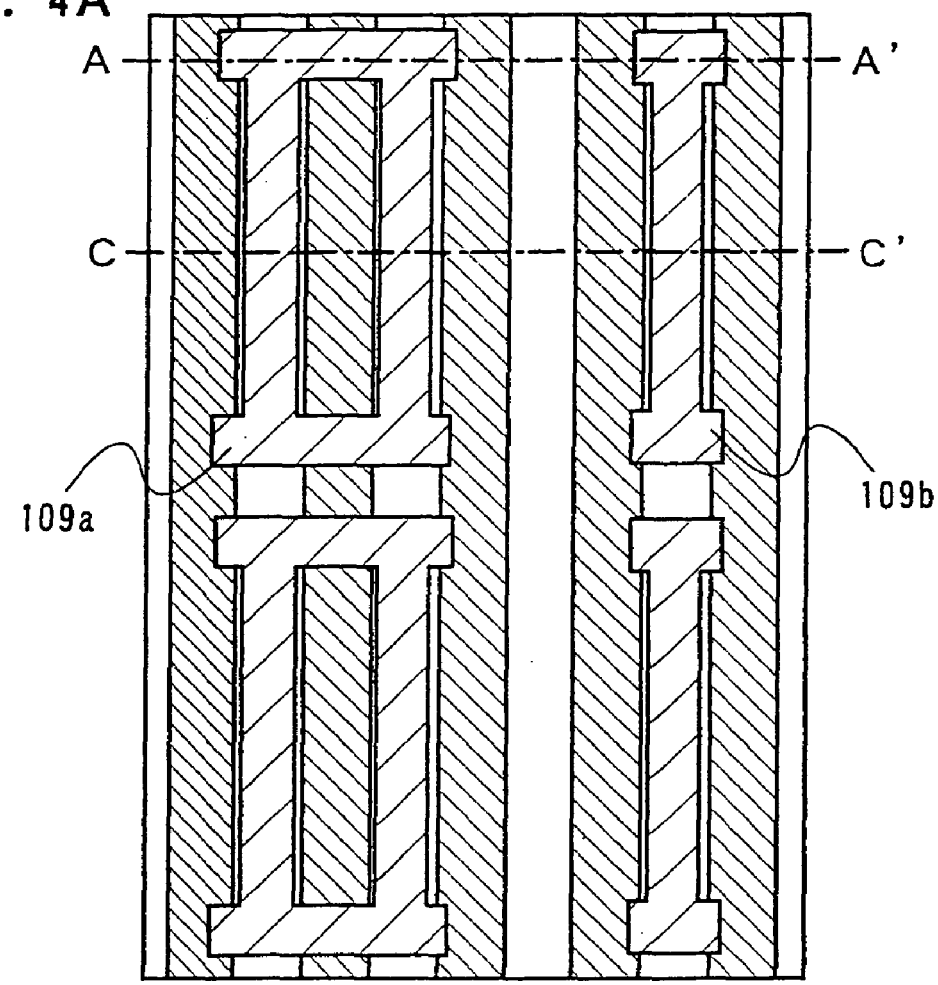
FIGS. 4A, 4B, and 4C are top and sectional views explaining the method of fabricating the transistor of the invention.
Figure 4B:
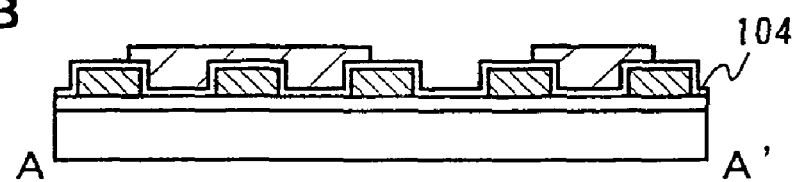
Figure 4C:
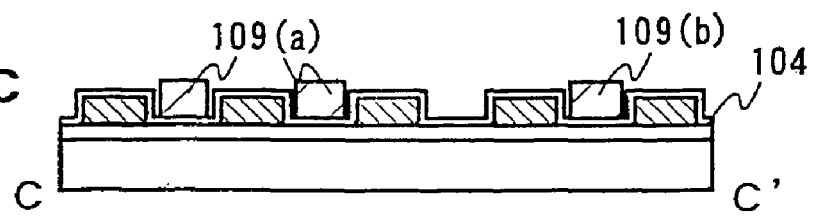

Next, FIG. 4 will be described. FIG. 4A is a top view, FIG. 4B is a sectional view corresponding to A-A', and FIG. 4C is a sectional view corresponding to C-C'. They show a situation where, after the patterning of the crystalline semiconductor film 107, dry etching or wet etching is carried out so that island-shaped semiconductor films (also called an active layer) 109(a) and 109(b) of the thin film transistors are formed.

The crystalline semiconductor film 107 can be etched selectively with regard to the buffer film 104 by use of fluorinated gas and oxygen as etching gas. Of course, it is acceptable that the buffer film 104 be etched provided that selectivity with the first insulating film 102, situated underneath the buffer film 104, can be assured. In addition, the etching may be carried out by use of plasma etching using a combination of $CF_4$, $O_2$ and $NF_3$ gas as etching gas, and plasma-less gas etching may be carried out using halogen fluoride gas such as $ClF_3$ gas and the like without excitation. Since the plasma-less gas etching does not cause plasma damage to the crystalline semiconductor film, it is an effective technique to prevent formation of crystal defects.

Also, when forming the island-shaped semiconductor films 109(a) and 109(b), it is preferable to taper an end part (edge) of the island semiconductor film. A taper angle may be between 20° to 85° (preferably 45° to 60°). By this, coverage (covering ratio) of a gate insulating film which will be formed later can be improved, and it is possible, for example, to prevent disconnection and short-circuit of the gate electrode.

In the crystalline semiconductor film which is obtained by carrying out the invention; no crystal grain boundary or defects are revealed by secco etching, which means an absence or a quasi absence of such defects in the crystalline semiconductor film. In addition, the secco etching means an etching technique using generally known secco solution (chemical in which a solution $HF:H_2O=2:1$ is mixed with a solution of $K_2Cr_2O_7$ as an additive) in order to reveal the crystal grain boundaries on the surface of the crystalline semiconductor film. In this specification, the secco solution means a solution prepared by dissolving 2.2 g of a solution of 0.15 mol/l of potassium dichromate ($K_2Cr_2O_7$) in 50 cc of water and adding 100 cc of hydrofluoric acid. The resulting solution is diluted 5 times with water. The secco etching mentioned in this specification is performed by applying the above-described secco solution at room temperature (10-30° C.) for 75 seconds.

So far, crystal grain boundaries have not been revealed by the secco solution, and it is a well known fact that thin film defects and crystal grain boundaries are preferentially etched by the secco etching. Of course, since it is not a single crystal, there may be grain boundaries and defects which are not revealed, but since such grain boundaries and defects would not influence the electrical characteristics of a semiconductor device during its fabrication, it is considered that they are neutral regarding electrical characteristics. Normally, an electrically inactive grain boundary is a plane-shaped grain boundary (low or high degree twin crystal or coincidence grain boundary), and a grain boundary not revealed by the secco etching is assumed to be a plane-shaped grain boundary. Considering the previous point, one can conclude that, with the possible exception of in-plane grain boundaries, there is substantially no crystal grain boundaries or defects in the semiconductor film formed as described above.

Figure 5A:
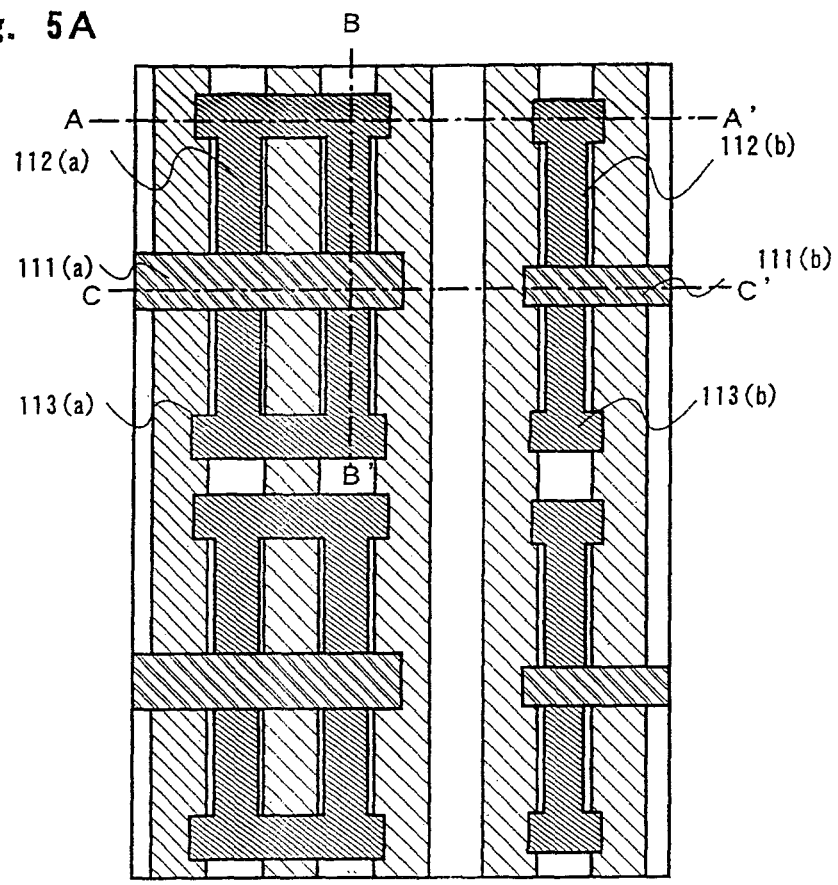
FIGS. 5A, 5B, 5C, and 5D are top and sectional views explaining the method of fabricating the transistor of the invention.
Figure 5B:
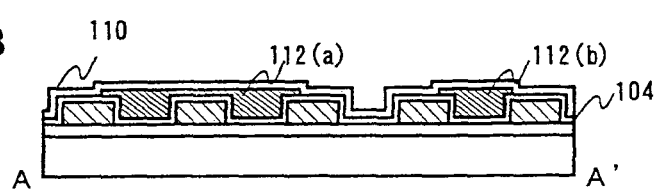
Figure 5C:
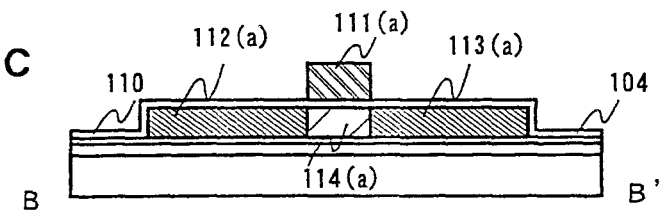
Figure 5D:
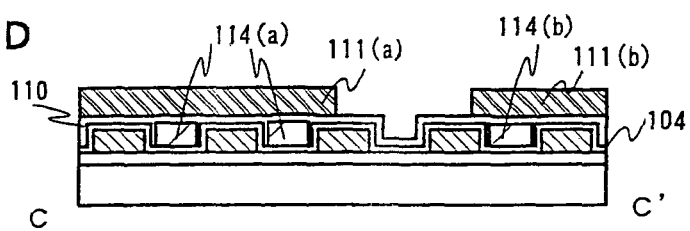

Next, FIG. 5 will be described. FIG. 5A is a top view, FIG. 5B is a sectional view corresponding to A-A', FIG. 5C is a sectional view corresponding to B-B', and FIG. 5D is a sectional view corresponding to C-C'. They show such a situation that, after the island-shaped semiconductor films 109(a) and 109(b) are formed, a gate insulating film 110 and gate electrodes 111(a) and 111(b) are formed.

As the gate insulating film 110, any of the above-described silicon oxide film, a silicon nitride film, a silicon oxynitride film, a silicon nitride-oxide film, an aluminum nitride film, an aluminum nitride-oxide film, an aluminum oxynitride film, and an aluminum oxide film may be used, and a laminated film formed by properly combining any of the previous listed films may be used. In order to achieve a good coverage of the gate insulating film, one of the following insulating films may be used: a silicon oxide film formed using TEOS (tetraethoxysilane), an aluminum nitride-oxide film formed by RF sputtering method, or a laminated film composed of an aluminum nitride-oxide film and a silicon oxide film (the silicon oxide film may be one in which an active layer of a semiconductor film is oxidized by hydrogen peroxide).

Also, the gate electrode 111 may be formed by tungsten, by an alloy including tungsten, tantalum, by an alloy including tantalum, by aluminum or an aluminum alloy, or the like.

Next, is shown a situation such that source regions 112(a) and 112(b) and drain regions 113(a) and 113(b) are formed in a self-aligning manner by using the gate electrodes 111(a) and 111(b) as masks. Also, by this process, channel forming regions 114(a) and 114(b) are clearly defined.

In this embodiment, in order to obtain p-type source regions 112(a) and 112(b) and drain regions 113(a) and 113(b), an element which belongs to the Group 13 (typically, boron is used) of the periodic table of the elements is added but, in order to obtain n-type, an element which belongs to the Group 15 (typically, phosphorous or arsenic are used) of the periodic table may be added. Any well known doping technique may be used. Also, according to need, a drain region with low density charge carriers (generally called an LDD region, where LDD stands for Lightly Doped Drain) may be formed.

Also, after the source regions 112(a) and 112(b) and drain regions 113(a) and 113(b) are formed, activation of the source regions 112(a) and 112(b) and drain regions 113(a) and 113(b) is carried out by use of furnace annealing, laser annealing, or RTA (rapid thermal annealing). In addition, RTA may be carried out by use of infrared or ultraviolet irradiation using a lamp as a light source, or by heated gas.

Figure 6A:
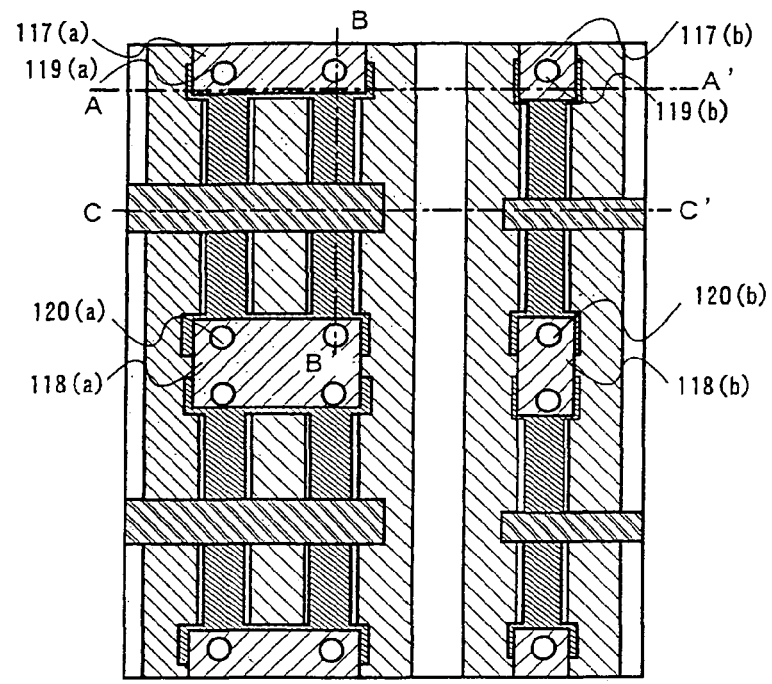
FIGS. 6A, 6B, 6C, and 6D are top and sectional views explaining the method of fabricating the transistor of the invention.
Figure 6B:
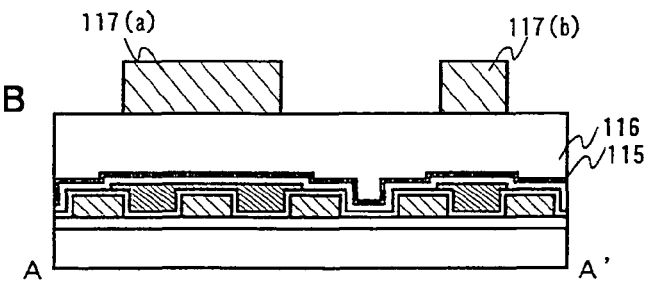
Figure 6C:
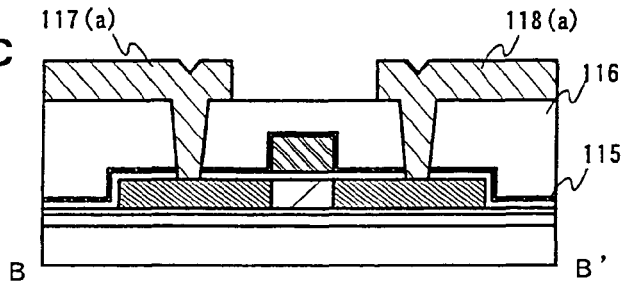
Figure 6D:
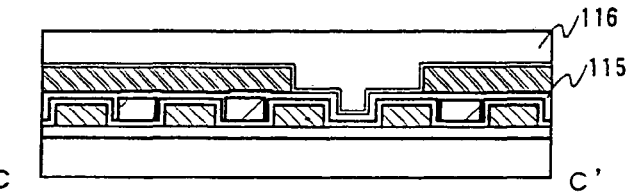

Next, FIG. 6 will be described. FIG. 6A is a top view, FIG. 6B is a sectional view corresponding to A-A', FIG. 6C is a sectional view corresponding to B-B', and FIG. 6D is a sectional view corresponding to C-C'. They show a situation such that source wirings 117(a) and 117(b) and drain wirings 118(a) and 118(b) are formed and a p-channel type thin film transistor is completed.

When the above-described activation process is finished, a protective film (passivation film) 115 is formed so as to cover the gate electrode 111 and the like. As for the protective film 115, it is preferable to use an insulating film in which content of nitrogen is high such as a silicon nitride film, a silicon nitride-oxide film, an aluminum nitride film, or an aluminum nitride-oxide film. These compositions are chosen to prevent the influence of alkali metal, moisture etc.

In addition, in this embodiment, the silicon nitride oxide (SiNxOy) film is used as the protective film 115, and after the film formation, heat treatment at 400-450° C. is carried out. Since the protective film 115 includes 15-25 atom % of hydrogen, hydrogen is diffused by the heat treatment, and even if there are dangling bonds in the channel forming regions 114a and 114b, they are effectively terminated by hydrogen.

After the protective film 115 is formed, an interlayer film (interlayer insulating film) 116 is formed. The interlayer film 116 may be formed of a silicon oxide film, a silicon nitride film, a silicon nitride-oxide film, a silicon oxynitride film or a laminated film formed by combining any of the previously listed films. Of course, a resin film may be used, if the resistance of the resin to heat is sufficient. Film thickness is not limited in particular but, it is preferable to have a film thickness so that the surface of the interlayer film 116 can be sufficiently flattened. In addition, after the interlayer film 116 is formed, planarization may be carried out by use of well known means such as CMP (chemical mechanical polishing) and the like.

Following, contact holes are formed in the interlayer film 116 (and others, as necessary), and the source wirings 117(a) and 117(b) and drain wirings 118(a) and 118(b) are formed by an aluminum film or a film comprising aluminum and other metal. Of course, instead of aluminum, copper or other low resistance conductor may be used. In addition, 119(a) and 119(b) designate areas where the source regions 112(a) and 112(b) are connected to the source wirings 117(a) and 117(b) respectively, and are called source contacts. Also, 120(a) and 120(b) designate areas where the drain regions 113(a) and 113(b) are connected to the drain wirings 118(a) and 118(b) respectively, and are called drain contacts. In this embodiment, since the source region and the drain region are formed covering the depressions and the projections formed by the second insulating film, it is possible to broaden the margin of the design for forming the source contacts 119(a) and 119(b) and the drain contacts 120(a) and 120(b).

In addition, a left side p-channel type transistor shown in FIG. 6D is of such a structure that a plurality of channel forming regions (two channel forming regions in this embodiment) are arranged in parallel, and disposed so as to make a junction between a pair of impurity regions (the source region 112(a) and the drain region 113(a) in this embodiment), i.e., is a transistor of multi-channel structure. Also, the width of the channel forming regions of this left side p-channel type thin film transistor is considered to be the sum of the widths of the two channel forming regions.

Figure 18:
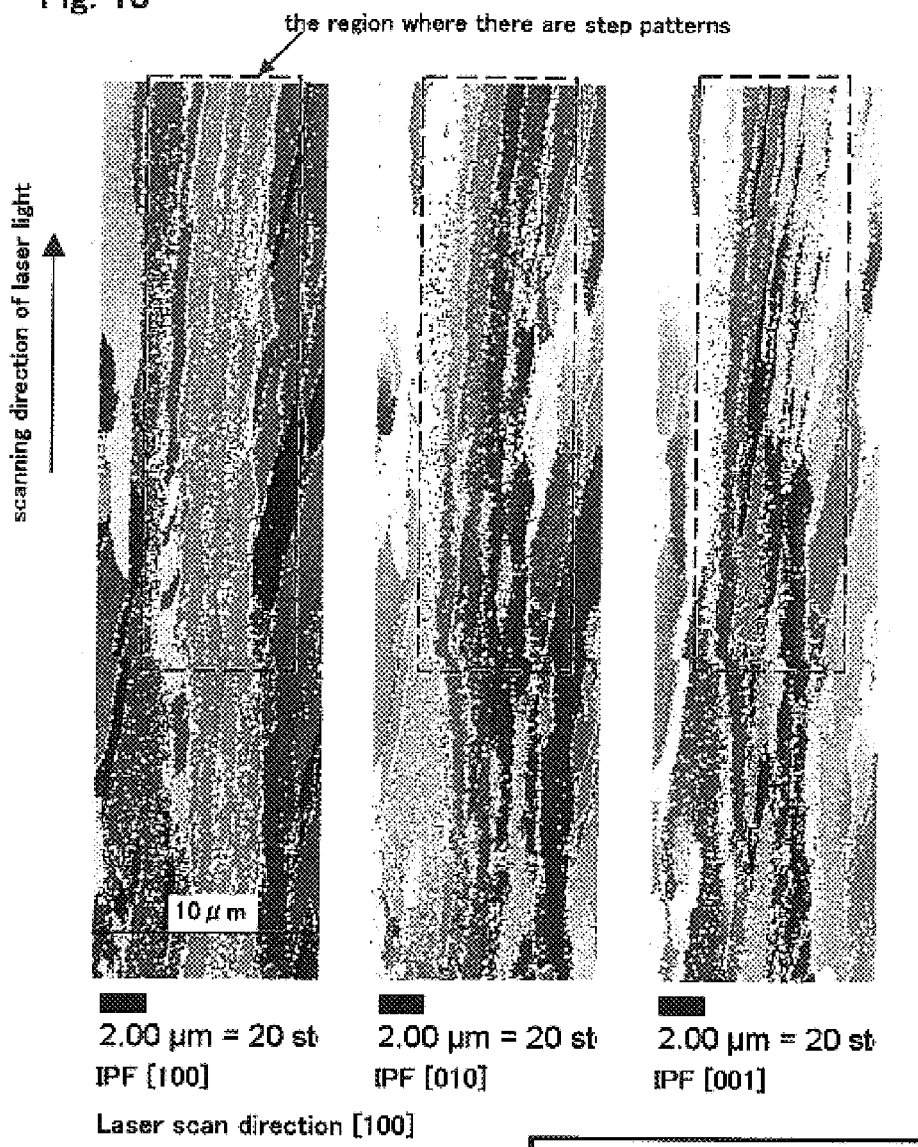
FIG. 18 is a view showing crystallinity of a transistor of the invention.

Also, FIG. 18 shows an observation of the orientation of the crystalline semiconductor film formed in the depressions obtained by EBSP (Electron Backscatter Diffraction Pattern). The EBSP observation method does not only measure surface orientation microscopic crystallinity, but also overall directions of a crystal by the use of a specific detector mounted in a SEM (Scanning Electron Microscopy) apparatus: an electron beam is irradiated to a crystalline plane, and identification of a crystal orientation from a Kikuchi line is image-recognized by a computer (hereinafter, this technique is called EBSP method for convenience).

Data in FIG. 18 shows that in the depressions, crystal has grown in a direction parallel to the scanning direction of the laser concentrated in a line shape. It is confirmed from FIG. 18 that plane directions of the growth are aligned almost uniformly in a same stripe (depression).

As described previously, according to the invention, it is possible to arrange the crystal planes of the crystalline semiconductor film formed in a same stripe of the insulating surface, in short, the plane direction of the crystal growth. And, the invention can reduce characteristic variation between the thin film transistors having channel regions formed from a same stripe of the crystalline semiconductor film.

Embodiment 2

As a formation method of the crystalline semiconductor film of this invention, although embodiment 1 shows a method where crystallization is obtained by laser irradiation of an amorphous semiconductor, another method such as a crystal formation by solid phase growth step followed by a recrystallization by laser irradiation melting step may be used.

For example, after that an amorphous semiconductor film 105 is formed as in FIG. 2, the amorphous semiconductor film 105 is doped with a metallic element such as nickel which possesses the catalyst effect to promote crystallization in such a way that the crystallization temperature of an amorphous semiconductor film (for example, an amorphous silicon film) is lowered, and the crystallinity thereof is raised.

This technique is described in detail in JP-A-11-354442 by the applicant. A crystalline semiconductor film obtained by combining a technique of nickel doping and the technique described in Embodiment 1 is also characterized by uniform crystallinity. If such crystalline semiconductor films are used for the channel forming regions of thin-film transistors, both mobility of electron and that of hole are improved significantly, with the result that field effect mobilities of an n-channel transistor and a p-channel transistor characteristics are improved as well.

Moreover, the method of nickel doping is not limited to a single one, and methods such as spin coating, vapor deposition or sputtering can be applied. When the spin coating is employed, a 5 ppm nickel acetate solution is coated to form a layer including the metallic element nickel. Of course, a catalyst element is not limited to nickel but other well-known materials may be used.

After its formation, the amorphous semiconductor film 105 is crystallized by a heat treatment conducted for 4 hours at 580° C. Laser beams or a strong light equivalent to the laser beams are irradiated onto this crystallized semiconductor film, so as to cause melting and re-crystallization. In this way, a crystalline semiconductor with a substantially planarized surface can be obtained similarly as that shown in FIG. 2.

An advantage of using a crystallized semiconductor film as a target for laser beam irradiation is the limited variation in the ratio of the optical transmittance of the semiconductor film. Even if laser beams are irradiated onto the crystallized semiconductor film so as to cause melting, the optical absorption coefficient is hardly changed. Therefore, the laser irradiation conditions can be specified with a large margin.

By using this method, metallic elements remain in the formed crystalline semiconductor film, but can be removed by a gettering treatment. This technique is described in detail in the Patent Application No. 2001-019367 (or in the Patent Application No. 2002-020801). Moreover, the heat-treatment accompanying this gettering treatment also has the effect of relaxing the strain of the crystalline semiconductor film.

Then, as shown in Embodiment 1, a thin-film transistor having a crystalline semiconductor film situated in a depression as a channel forming region and using a crystalline semiconductor film situated on projections as a source region or a drain region is formed. As described previously, according to the invention, it is possible to arrange the crystallinity of a crystalline semiconductor film formed in a same stripe on the insulating surface, in short, the plane direction of the crystal growth. And, the invention can reduce characteristic variation between the thin film transistors having channel regions formed from a same stripe of the crystalline semiconductor film.

Embodiment 3

Next, by use of FIG. 8, an example will be described, in which it is shown that a length of the stripe pattern equal to the length of the channel forming region of the transistor can be formed.

Figure 8A:
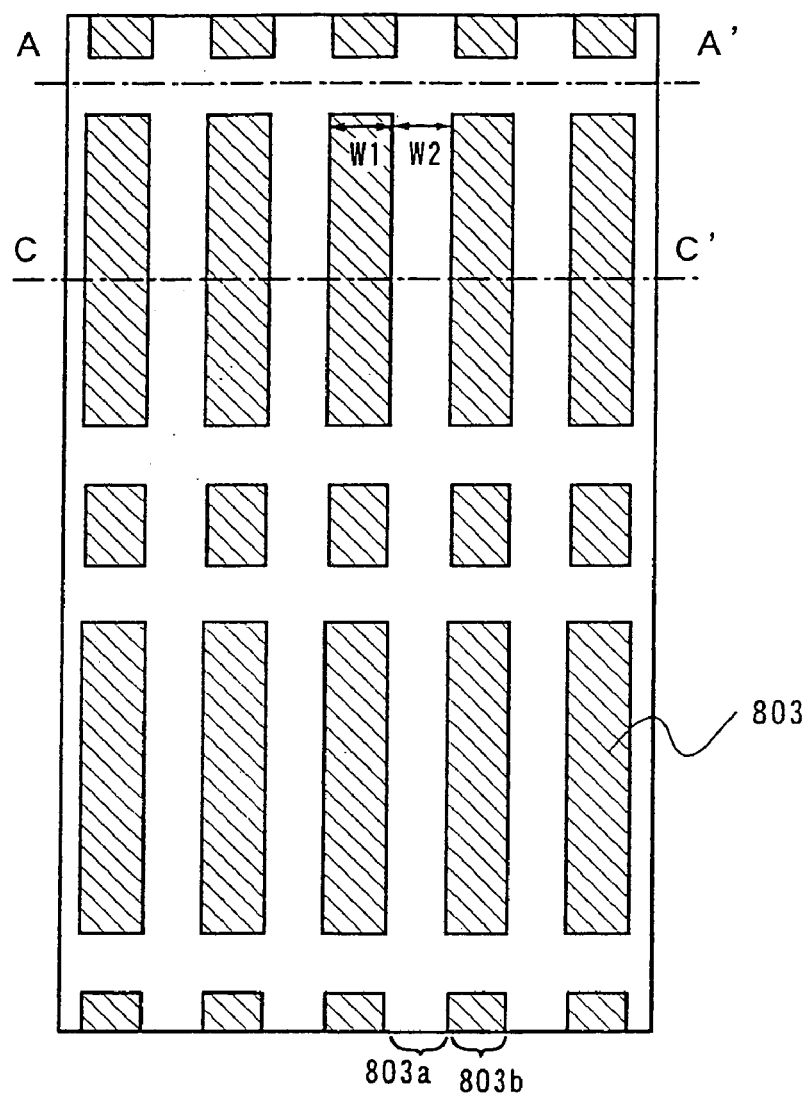
FIGS. 8A, 8B, and 8C are top and sectional views explaining the method of fabricating the transistor of the invention.
Figure 8B:
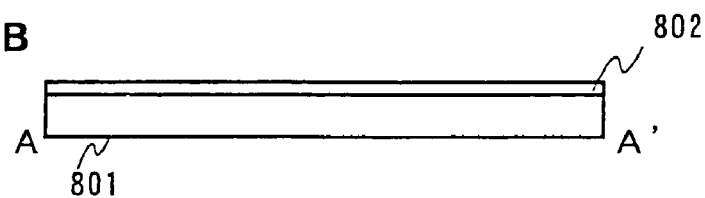
Figure 8C:
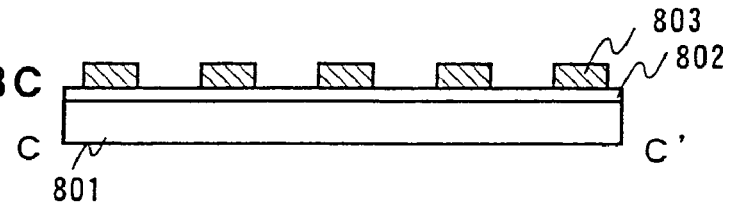

FIG. 8 is a top view, FIG. 8B is a sectional view corresponding to A-A, and FIG. 8C is a sectional view corresponding to C-C'. They show a situation where a first insulating film 802 and a second insulating film 803 formed in linear stripe patterns are formed on a substrate 801. In addition, a portion shown by 803a indicates a depression, and a portion shown by 803b indicates a projection.

A feature of this embodiment is that the length of the linear stripe pattern is set so that a channel forming region of a transistor can be formed. That is, looking at the sectional view of A-A', the second insulating film 803 is absent, and looking at the sectional view of C-C', the second insulating film 803 is disposed in a stripe shape. Also, the first insulating film and the second insulating film may be formed by use of a material and a fabricating method which are similar to those in Embodiment 1.

Also, in the same manner as in Embodiment 1, it is preferable that the width (W1) of the second insulating film 803 which is formed in a linear stripe pattern be between 0.1 and 10 μm (preferably between 0.5 and 1 μm), and that an interval (W2) between the neighboring second insulating films be between 0.01 and 2 μm (preferably between 0.1 and 1 μm), and that thickness (d) of the second insulating film be between 0.01 and 3 μm (preferably between 0.1 and 2 μm).

Thereafter, in the same manner as in Embodiment 1, an insulating film 804 which functions as a buffer (hereinafter, referred to as a buffer film) is formed so as to cover surfaces including the first insulating film 802 and the second insulating film 803, and depressions 803a, and thereafter, an amorphous semiconductor film is continuously formed to be 0.01 to 3 μm thick (preferably, 0.1 to 1 μm) without being exposed to the atmosphere.

Figure 9A:
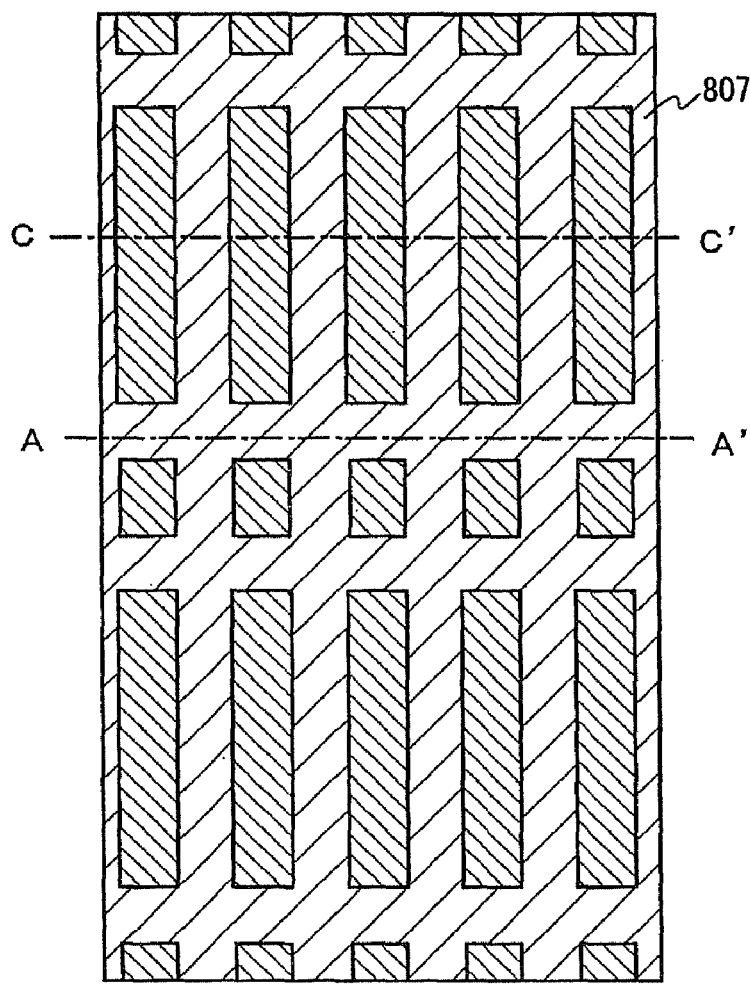
FIGS. 9A, 9B, and 9C a are top and sectional views explaining the method of fabricating the transistor of the invention.
Figure 9B:
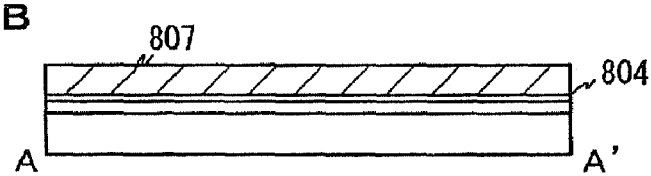
Figure 9C:
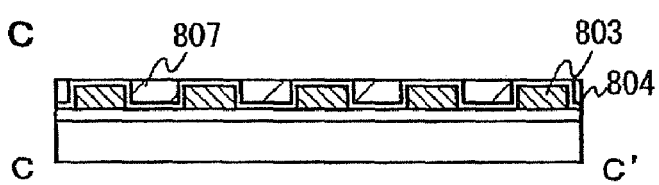
Figure 10A:
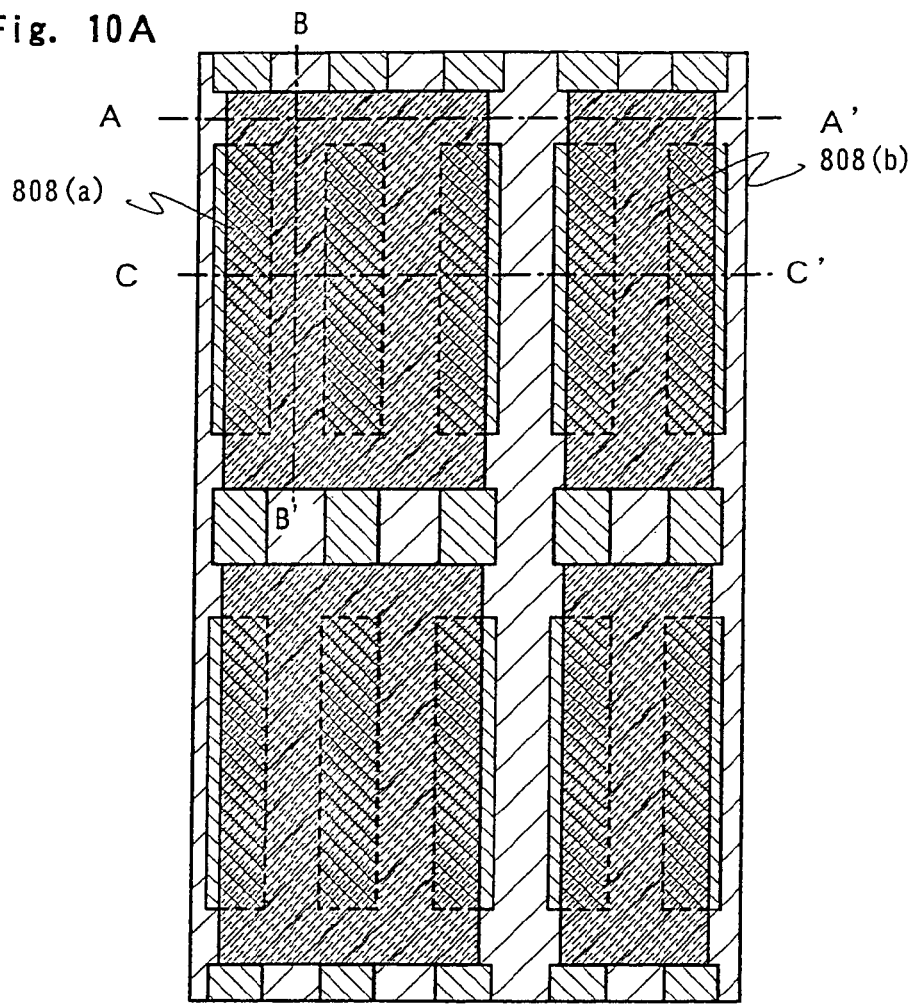
FIGS. 10A, 10B, 10C, and 10D are top and sectional views explaining the method of fabricating the transistor of the invention.
Figure 10B:
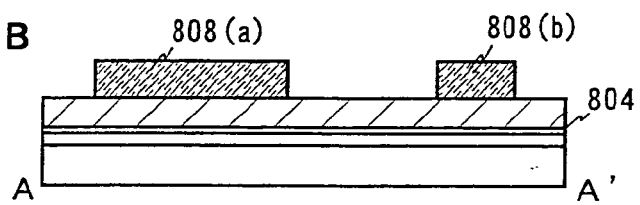
Figure 10C:
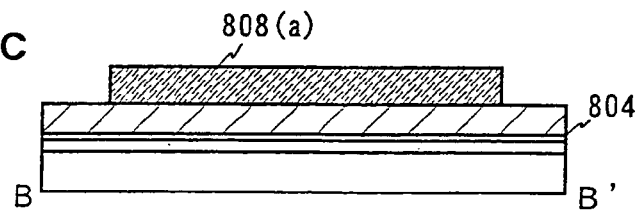
Figure 10D:
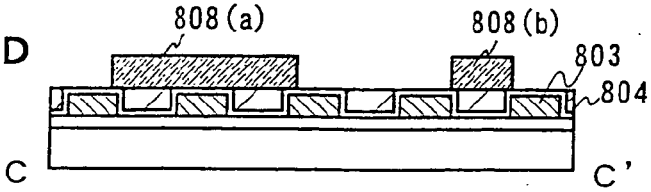

Next, FIG. 9 will be described. FIG. 9 shows that, by irradiating continuous wave line-shaped laser light to the amorphous semiconductor film, a crystalline semiconductor film 807 is obtained. FIG. 9A is a top view, FIG. 9B is a sectional view corresponding to A-A', and FIG. 9C is a sectional view corresponding to C-C'.

After that, the crystalline semiconductor film 807 is etched by dry etching or wet etching to expose the second insulating film 803 (or the buffer film 804 thereon). By this process, it is possible to selectively leave the crystalline semiconductor film 807 only in the depressions (FIG. 9C). At this time, since the second insulating film is not present in the source region and the drain region, there is no necessity to dispose resist masks to pattern the crystalline semiconductor film for use in the source wiring and the drain wiring. Therefore, by the shape of the second insulating film 803 in this embodiment and by etching the crystalline semiconductor film 807, it is possible to reduce the number of masks.

In addition, the above-described etching process may be carried out not only by dry etching method or wet etching method but also by a mechanical polishing method such as CMP (Chemical Mechanical Polishing). Also, it is acceptable to use a chemical method and a mechanical method at the same time.

Next, as shown in FIG. 10, resist masks 808(a) and 808(b) are formed. FIG. 10A is a top view, FIG. 10B is a sectional view corresponding to A-A', FIG. 10C is a sectional view corresponding to B-B', and FIG. 10D is a sectional view corresponding to C-C'. The crystalline semiconductor film is patterned by using the resist masks 808(a) and 808(b) as masks and island-shaped semiconductor films are obtained.

As for the subsequent processes to be carried out after the step described above, it is perfectly acceptable to refer to the processes described in Embodiment 1, and thus, descriptions will be omitted in this embodiment.

This embodiment is characterized in that there is no insulating film 803 in the source region and the drain region of the island-shaped semiconductor film formed. As just described, since there is no insulating film 803 in the source region and the drain region, the possibility that the source wiring and the drain wiring are disconnected is lowered, and further, probabilities of bad contacts are reduced, and degree of freedom for circuit design of a semiconductor device is increased.

Also, according to this embodiment, since the channel forming region can be formed in a self-aligning manner by using the second insulating film 803, it is possible to prevent the channel forming region from being formed erroneously on the projection of the second insulating film due to pattern misalignment when the channel forming region is formed, and it is possible to decrease the probability of the formation of crystal grain boundary in the channel forming region, and it is thus possible to improve process yield.

In addition, the process in which the crystalline semiconductor film 807 is etched by dry etching or wet etching to expose the second insulating film 803 (or the buffer film 804 thereon) in this embodiment can be combined with Embodiments 1 and 2.

Embodiment 4

Figure 11A:
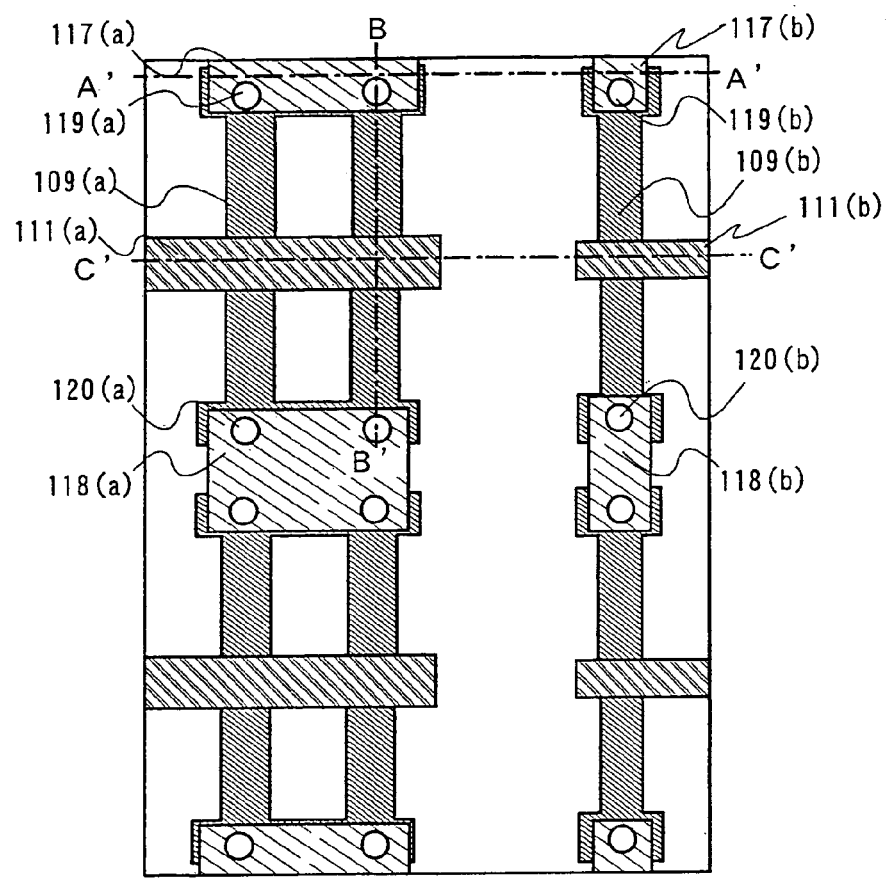
FIGS. 11A, 11B, 11C, and 11D are top and sectional views explaining the method of fabricating the transistor of the invention.
Figure 11B:
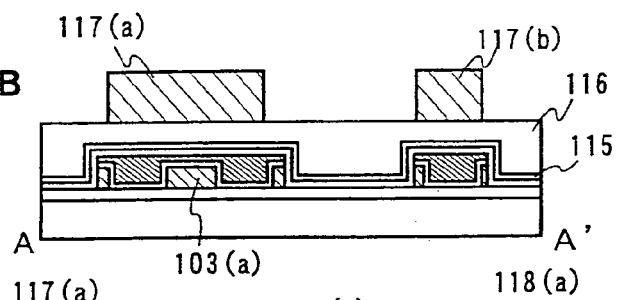
Figure 11C:
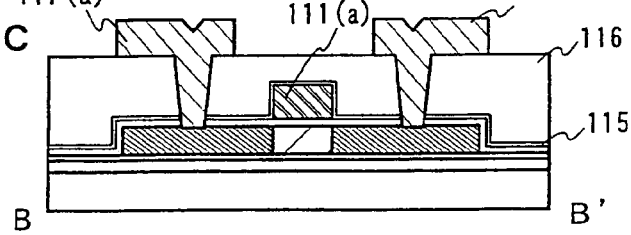
Figure 11D:
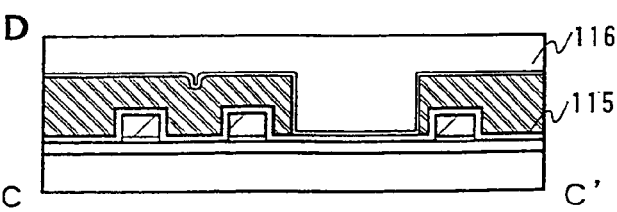

This embodiment shows an example in which, after the island-shaped semiconductor films 109(a) and 109(b) are formed as in Embodiment 1, the second insulating film 103 is removed. FIG. 11A is a top view of a thin film transistor in case that this embodiment is carried out, and FIGS. 11B to 11D are sectional views corresponding to the lines A-A', B-B' and C-C', respectively. Also, numerals and signs of each figure correspond to the numerals and the signs of the figures which are used in Embodiment 1.

In this embodiment, by removing the second insulating film 103 in the area other than under the island-shaped semiconductor films 109(a) and 109(b) as shown in FIG. 11D, a gate electrode covers even side surfaces of the island-shaped semiconductor films 109(a) and 109(b) so that the width of the effective channel forming region increases and the drive capability of the thin film transistor increases. Also, this embodiment, points out that the number of unnecessary steps is reduced on a surface of the substrate, and since it is possible to decrease the number of steps formed by the second insulating film 103 that lead wirings such as gate wirings, source wirings, and drain wirings climb have to cross, it is possible to avoid defects such as disconnection due to climb-over errors.

In addition, this embodiment can be freely combined with any one of Embodiments 1 to 3.

Embodiment 5

The structure of a laser irradiation apparatus used in this embodiment will be explained referring to FIG. 12. In addition, although two sets of laser oscillation apparatuses are used in FIG. 12, the laser oscillation apparatus may not be limited to this number, but three sets or four sets, or more, may be used.

Also, the temperature of a laser oscillation apparatus 11 is kept constant using a chiller 12. The chiller 12 is not necessarily present, but keeping the temperature of the laser oscillation apparatus 11 constant makes it possible to control the fluctuations of the outputted energy of laser beams which are function of the temperature.

Also, numeral 14 is an optical system, and can change the light path outputted from the laser oscillation apparatus 11, or can condense laser beams by modifying the form of the laser beams. Furthermore, the laser beams outputted from a plurality of the laser oscillation apparatuses 11 are synthesized by partially overlapping each other using the optical system 14 in the laser irradiation apparatus of FIG. 12.

In addition, an AO (Acousto-Optic) modulator 13 which can primarily intercept laser beams completely may be placed in a light path between a substrate under process 16 and the laser oscillation apparatus 11. Moreover, instead of the AO modulator, an attenuator (light intensity correction filter) may be provided to adjust the energy density of laser beams.

Moreover, a measuring means 20 (energy density measurement means) to measure the energy density of laser beams outputted from the laser oscillation apparatus 11 may be placed in a light path between the processing substrate 16 and the laser oscillation apparatus 11, so that a change of energy density with time may be monitored by a computer 10. In this case, an output from the laser oscillation apparatus 10 may be heightened so that the attenuation of the energy density of the laser beams may be compensated.

The synthesized laser beams are irradiated onto the substrate 16, which is an object under process, through a slit 15. The slit 15 is capable of intercepting the laser beams and is preferably formed of a material resistant to transformation or damage inflicted by the laser beams. Also, the width of the slit 15 is variable and the width of the laser beams can be changed by the width of the slit accordingly. In addition, the use of a slit is not always necessary.

In addition, in the case of not passing through the slit 15, shapes of the laser beams on the substrate 16 which are oscillated from the laser oscillation apparatus 11 depend on the kinds of laser, and can be modified by an optical system.

The substrate 16 is laid on the stage 17. In FIG. 12, the position control means 18 and 19 are control means to control the position of the laser beams on an object under process, and the position of the stage 17 is controlled by the position control means 18 and 19. In FIG. 12, the position control means 18 performs position control of the position of the stage 17 in the X direction, and the position control means 19 performs position control of the stage 17 in the Y direction.

Figure 12:
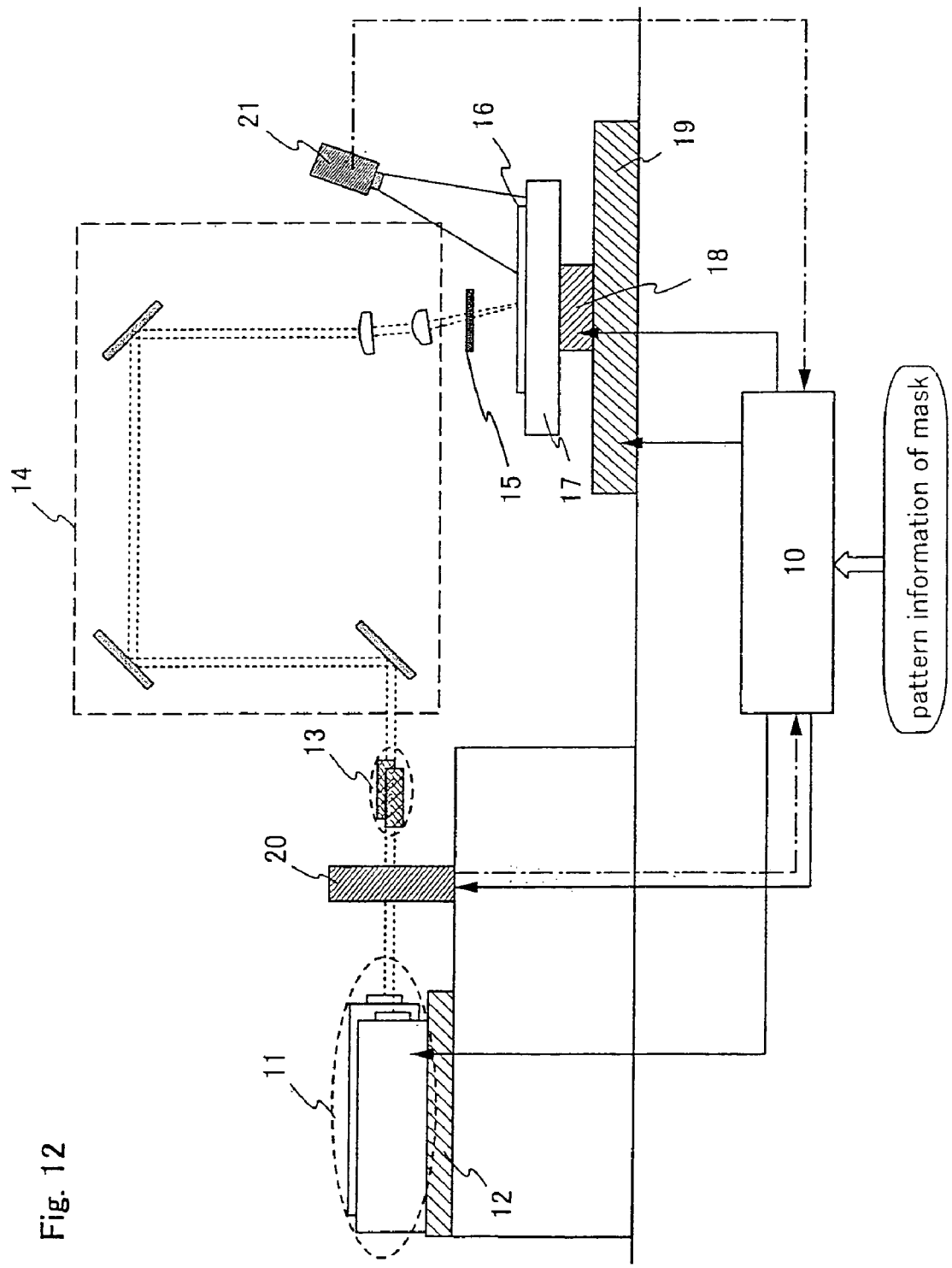
FIG. 12 is a view showing a laser irradiation apparatus which is used in an embodiment of the invention.

In addition, in FIG. 12, the position of the laser beams is controlled by moving a substrate, but the movement may be carried out using optical systems, such as a galvano-mirror, or both of them may be used.

Also, a laser irradiation apparatus of FIG. 12 includes a computer 10 having a memory means such as a memory and a central processing units. The computer 10 controls the oscillation of the laser oscillation apparatus 11 and defines the scanning course of the laser beams, and the position control means 18 and 19 are controlled so that the laser beams may be scanned according to a predetermined scanning course, in order to move the substrate to a predetermined position.

Furthermore, in FIG. 12, the width of the slit 15 can be controlled by the computer 10, and the width of the laser beams can be changed according to a pattern information of a mask.

Furthermore, the laser irradiation apparatus may be equipped with a correction means to adjust a temperature of a processing object. Also, since the laser beams have directivity and a high energy density, a damper may be formed to prevent reflected light from irradiating onto an improper part. Damper is preferably to be absorbent for the reflected light. In addition, cooling water may be circulated in a damper beforehand to prevent the temperature of a wall from rising by absorption of the reflected light. Moreover, a heating means (substrate heating means) for heating the substrate may be formed in the stage 17.

In addition, when forming markers by laser light as references for mask alignment, a laser oscillation apparatus for markers may be provided. In this case, oscillation of the laser oscillation apparatus for markers formation may be controlled by the computer 10. Furthermore, when providing a laser oscillation apparatus for the markers, an optical system for condensing the laser beams outputted from the laser oscillation apparatus for the markers formation is provided separately. In addition, as for a laser beam used to form the marker, a YAG laser or a $CO_2$ laser are typically used. However, other laser sources can also be used for making a marker, of course.

Moreover, for alignment by use of a marker, a single CCD camera 21, or, according to the situation, several CCD cameras may be provided. Incidentally, a CCD camera means the camera using a CCD (charge coupled device) as an image sensor. Moreover, without forming a marker, patterns of an insulating film or a semiconductor film can be recognized by using the CCD camera 21 and alignment of the substrate may be performed. In this case, by comparing the pattern information on an insulating film and a semiconductor film corresponding to masks and inputted into the computer 10 with the pattern information on the actual insulating film or a semiconductor film obtain with the help of the CCD camera 21, the position information on the substrate can be grasped. In this case, the marker is not necessarily formed.

Moreover, laser beams incident to the substrate are reflected on the surface of the substrate and return in the same path as when it was incident. Here, the returning laser light is called a return light. However, this return light has adverse influences, such as changes of output and frequency of the laser light, and destruction of a rod. Therefore, in order to remove the return light and to stabilize the oscillation of laser, an isolator may be installed.

In addition, the constitution of a laser irradiation apparatus having a plurality of laser oscillation apparatuses formed therein is shown in FIG. 12. An advantage of the constitution described above is that the conception of an optical system becomes easy. When a semiconductor film is melted, it is preferable to use linear laser beams especially from a viewpoint of the improvement of a throughput. However, if the longer direction of laser beams (X-axis direction in FIG. 2) becomes further longer, the optical design must become more precise. Therefore, a burden of an optical design can be eased by overlapping a plurality of linear laser beams.

Figure 13A:
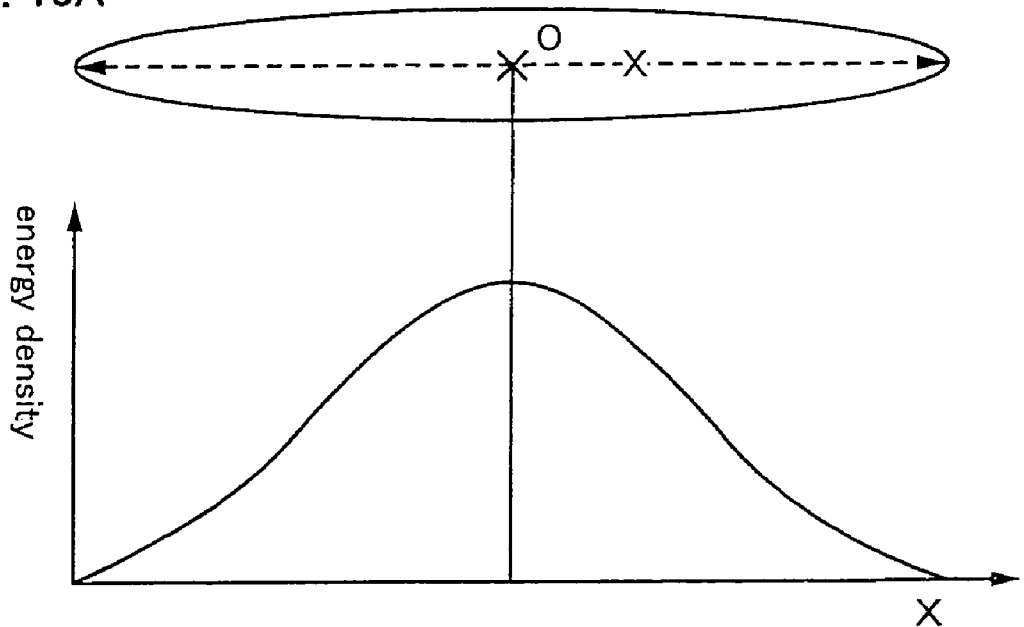

For example, one linear laser beam can be formed by optically combining a plurality of laser beams oscillated from a plurality of laser oscillation apparatuses. FIG. 13A is a view showing the irradiation section of each laser beam. The case where the irradiation region of laser beams corresponds to an ellipse is presented as an example here. However, the shapes are not relevant.

The shapes of laser beams vary according to the kinds of laser, and can be modified by the optical system. For example, the shape of the laser beams irradiated from the XeCl excimer laser apparatus L3308, produced by Ramda Co. LTD. (wavelength of 308 nm and pulse width of 30 ns) provides a rectangle shape of 10 mm×30 mm (referring to half-power bandwidth in beam profiles). Also, the shape of the laser beam irradiated from a YAG laser beam apparatus becomes circular if the rod has a cylinder shape. If it is a slab type, the shape of the laser beam becomes rectangular. The laser beam with a desired size can also be formed by modifying such laser beams further by an optical system.

The distribution of the energy density of the laser beam in the major axis direction of the laser beams (X-axis direction) shown in FIG. 13A is shown in FIG. 13B. The laser beam area shown in FIG. 13A corresponds to the region of a section of the laser beam which has an energy density larger or equal to $1/e^2$ of the peak value of the energy density shown in FIG. 13B. As for the distribution of the energy density of the ellipse-shaped laser beam, the energy density increases with the proximity to the center O of the ellipse. Thus, the energy density of the laser beam shown in FIG. 13A in the direction of a main axis follows a Gaussian distribution, and the region as judged to be uniform in energy density becomes narrow.

Figure 13C:
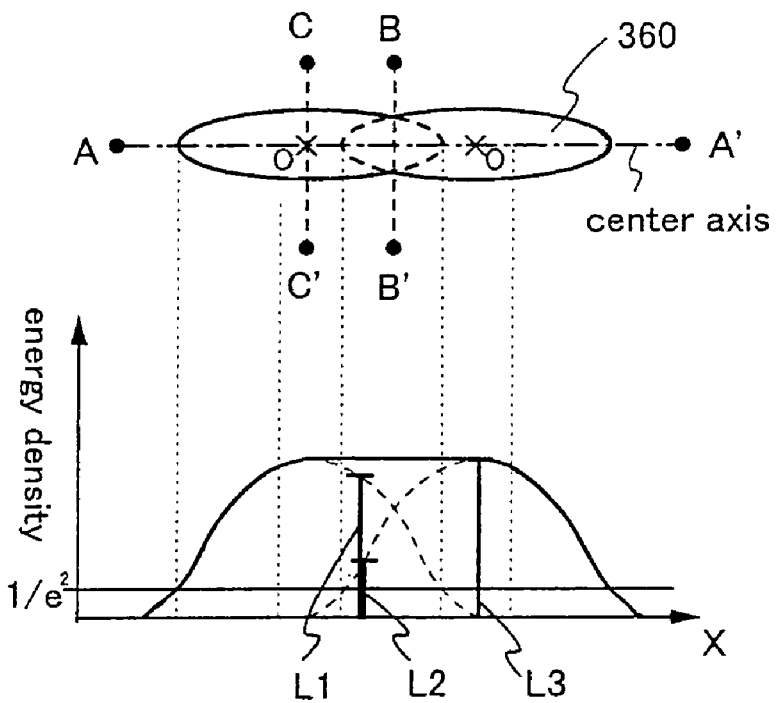

Next, an irradiation sectional shape of the linear laser beam formed by the combination of two laser beams shown in FIG. 13A, is shown in FIG. 13C. In addition, FIG. 13C shows the case where one linear laser beam is formed by overlapping two laser beams. The number of the laser beams that can be overlapped is not limited thereto.

As shown in FIG. 13C, the major axes of the ellipse of the combined laser beams correspond to each other, and the combination is carried out by partially overlapping parts of the laser beams to produce one linear laser beam. In addition, hereafter, the straight line obtained by connecting the center O of each ellipse is set as the center axis of the laser beam.

The distribution of the energy density in the center axis X direction of the linear laser beam after combination shown in FIG. 13C is shown in FIG. 13D. In addition, the laser beam shown in FIG. 13C corresponds to the region of a section of the laser beam which has an energy density larger or equal to $1/e^2$ of the peak value of the energy density shown in FIG. 13B. Energy density is added in the portion where each laser beam before synthesis is overlapped. For example, if the energy densities L1 and L2 of the overlapped laser lights are added as shown in the figure, the resulting energy density becomes almost equal to the peak value L3 of the energy density of each laser beam, and the resulting energy density between the centers O of each ellipse is almost constant.

Ideally, the result of the addition of L1 and L2 is L3. However, practically speaking, this result is not necessarily strictly equal to L3. The permissible deviation level between the value by adding L1 and L2 and the value L3 can be suitably determined by the designer.

If a single laser light is used, since energy density follows Gaussian distribution, it is difficult to irradiate a laser beam of uniform energy density onto the whole semiconductor film which is in contact with the flat portion of the insulating film. However, as shown in FIG. 13D, by overlapping a plurality of laser beams so as to combine the parts where energy density is lower, the region with uniform energy density is expanded so as to raise the crystallinity of a semiconductor film efficiently compared with the case where a plurality of laser beams are not used in an overlapping manner, but are used independently.

In addition, as for the distribution of energy density, B-B' is a little smaller than C-C'. However, B-B' and C-C' can be considered to be almost equal, and the shape of the laser beam synthesized in the region with energy density of the $1/e^2$ of the peak value of the laser beam before synthesis can be considered as linear.

In addition, a region of low energy density exists at the periphery of the irradiation region of the combined linear laser beam. Since crystallinity may be degraded if this region is used, it can be preferable to use the slit 15 as shown in FIG. 12 in order not to use the outer edge of the linear laser beam.

When carrying out the laser beam irradiation process of this invention, the laser irradiation apparatus described in this embodiment can be used. It can be adapted to any one of the embodiments 1 to 4. Although linear laser beams have advantages, there arises a problem of the rising cost of the optical system or laser oscillation apparatus. If a desired linear laser beam can be obtained by combining a laser oscillation apparatus with an optical system, it is acceptable to use such a laser irradiation apparatus.

EXAMPLES

Example 1

This example describes the formation of an analog circuit comprising a current mirror circuit and the formation of an analog circuit comprising a differential amplifier circuit, formed by use of the present invention.

FIGS. 14A-1 and 14A-2 show an equivalent circuit diagram of the current mirror circuit and a top view of a layout example. In addition, polarities of thin film transistors 1510 and 1511 of the current mirror circuit are, for example, of p-channel type.

Looking at FIG. 14A-1, a power line Vdd and drain electrodes of the thin film transistors 1510 and 1511 are connected, the gate electrode of the thin film transistor 1510 and the gate electrode and the source electrode of the thin film transistor 1511 are connected, and the source electrode of the thin film transistor 1511 is connected to Vss through a current source. Thin film transistors which are required to have conformance are the thin film transistors 1510 and 1511 surrounded by the dotted line.

Also, looking at FIG. 14A-2, the gate electrode is disposed on an island-shaped semiconductor film which is formed between insulating films, and thereafter, source wiring or drain wiring is disposed. The source wiring and the drain wiring are connected to the impurity regions (the source region and the drain region) of the island-shaped semiconductor film through contact holes. Channel forming regions of the thin film transistors 1510 and 1511 are formed from same stripes of the crystalline semiconductor film.

That is, among thin film transistors which form the current mirror circuit as the analog circuit, the channel forming regions of the thin film transistors with the same polarity are formed from a same stripe. And, among thin film transistors which form the current mirror circuit of the analog circuit, channel forming regions of the thin film transistors which share at least a gate electrode (i.e., thin film transistors which are electrically connected to the same gate electrode) are formed from same stripes.

This island-shaped semiconductor film may be formed by any of the methods of Embodiments 1 to 5.

Of course, polarities of the thin film transistors of the current mirror circuit may be of n-channel type.

FIGS. 14B-1 and 14B-2 show an equivalent circuit diagram of the differential amplifier circuit and a top view of a layout example. In addition, polarities of thin film transistors 1512 and 1513 of the differential amplifier circuit are of p-channel type and polarities of 1514, 1515, and 1600 are of n-channel type by way of example.

Looking at FIG. 14B-1, a power line Vdd and drain electrodes of the thin film transistors 1512 and 1513 are connected. A gate electrode of the thin film transistor 1512 and a gate electrode and a source electrode of the thin film transistor 1513 are connected. A source electrode of the thin film transistor 1512 and a source electrode of the thin film transistor 1514 are connected. The source electrode of the thin film transistor 1513 and the source electrode of the thin film transistor 1515 are connected. The drain electrode of the thin film transistor 1514 and the drain electrode of the thin film transistor 1515 are connected to Vss through the thin film transistor 1600. Thin film transistors which are required to have conformance are the thin film transistors 1512 and 1513 surrounded by a dotted line and the thin film transistors 1514 and 1515 surrounded by a dotted line.

Looking at FIG. 14B-2, a gate electrode is disposed on an island-shaped semiconductor film which is formed between insulating film, and thereafter, a source wiring or a drain wiring is disposed. The source wiring and the drain wiring are connected to the impurity regions (the source region and the drain region) of the island-shaped semiconductor film through contact holes. It is shown that channel forming regions of the thin film transistors 1512 and 1513 which are surrounded by a dotted line and required to have conformance are formed from same stripes of the crystalline semiconductor film, and channel forming regions of the thin film transistors 1514 and 1515 which are surrounded by another dotted line and required to have conformance are formed from same stripes of the crystalline semiconductor film.

That is, among thin film transistors which form the differential amplifier circuit as the analog circuit, the channel forming regions of the thin film transistors with the same polarity are formed on the same line. Also, among thin film transistors which configure the differential amplifier circuit as the analog circuit, channel forming regions of the thin film transistors which share at least a gate electrode (i.e., thin film transistors which are electrically connected to the same gate electrode) are formed on the same line. In an analog circuit to which a plurality of input signals are applied, channel forming regions of thin film transistors with the same polarity having gate electrodes to which the same input signal is inputted are formed on the same line.

In addition, FIGS. 14A-1 to 14B-2 describe examples where the number of the island-shaped semiconductor films which function as the channel forming regions of the p-channel type thin film transistors is three, and the number of the island-shaped semiconductor films which function as the channel forming regions of the n-channel type thin film transistors is two, but the invention is not limited to this. A designer may properly determine those parameters from the field effect mobility of the thin film transistor and the desired characteristics for a circuit. In addition, the width of the stripes of the island-shaped semiconductor films which form the channel forming regions of the p-channel type thin film transistors may be different from those of the n-channel type thin film transistors. However, it is desirable for these widths to be identical in order to facilitate a crystallization process and to ensure uniform crystallinity.

As described in the invention, since the crystallinity of the island-shaped semiconductor films of the thin film transistors included in the current mirror circuit and the differential amplifier circuit, which are required to have conformance, is uniform, variation between those thin film transistors is small, and it is possible to obtain a current mirror circuit and a differential amplifier circuit which have high conformance. Also, since by designating an area in which the channel forming region is formed, it becomes possible to form a crystalline semiconductor area free of crystal grain boundary, it is possible to obtain a current mirror circuit and a differential amplifier circuit which are capable of high speed operations and have high current driving capabilities.

A pixel portion of a light emitting display device and a current source (constant current source) of a signal line drive circuit which have the current mirror circuits formed by the invention can obtain high conformance, and performance of the light emitting display device can thereby be improved.

Example 2

This example will describe a circuit of an analog switch which is formed by using the invention.

FIGS. 15A and 15B show an equivalent circuit diagram of two neighboring analog switches SW1 and SW2 (analog switches surrounded by a broken line) and a top view of a proposed layout. In addition, for illustration purposes, polarities of thin film transistors 1516 and 1518 of the two analog switches are of p-channel type, and polarities of 1517 and 1519 are of n-channel.

Thin film transistors which are required to have conformance in the analog switch of this example are the thin film transistors 1516 and 1518, or the thin film transistors 1517 and 1519. This example describes an example of switches formed by two thin film transistors which are required to have conformance but, the invention is not limited to switches formed by two thin film transistors.

Looking at FIG. 15A, a wiring to which an input signal (Signal) is inputted, the gate electrode of the thin film transistor 1517 of SW1, and the gate electrode of the thin film transistor 1519 of SW2 are connected. A wiring to which an inversion signal (Signal b) is inputted, the gate electrode of the thin film transistor 1516 of SW1, and the gate electrode of the thin film transistor 1518 of SW2 are connected. An input signal $V_{IN}$ is inputted to SW1 and SW2, and an output signal $V_{OUT}$ is outputted from SW1 and SW2.

Also, looking at FIG. 15B, a gate electrode is disposed on an island-shaped semiconductor film which is formed between insulating films, and thereafter, a source wiring and a drain wiring are disposed. The source wiring and the drain wiring are connected to the impurity regions (the source region and the drain region) of the island-shaped semiconductor film through contact holes. It is shown that channel forming regions of the thin film transistors 1516 and 1518 which are required to have one conformance are formed from same stripes of a crystalline semiconductor film, and channel forming regions of the thin film transistors 1517 and 1519 which are required to have another conformance are formed from same stripes of a crystalline semiconductor film.

In addition, FIGS. 15A and 15B describe such an example that the number of the island-shaped semiconductor films which function as the channel forming regions of the p-channel type thin film transistors is three and the number of the island-shaped semiconductor films which function as the channel forming regions of the n-channel type thin film transistors is two, but the invention is not limited to this. A designer may properly determine those parameters from the field effect mobility of the thin film transistor and the desired characteristics for a circuit. In addition, the width of the stripes of the island-shaped semiconductor films which form the channel forming regions of the p-channel type thin film transistors may be different from those of the n-channel type thin film transistors. However, it is desirable for these widths to be identical in order to facilitate a crystallization process and to ensure uniform crystallinity.

As described above, in the invention, since the channel forming regions of the thin film transistors, which are required to have conformance and belonging to a plurality of analog switches, are formed from same stripes of the crystalline semiconductor films with uniform crystallinity, it is possible to obtain analog switches whose circuits present small variations, thus insuring uniform characteristics of the said analog switches.

Since a pixel part of a light emitting display device comprising the analog switches formed by the invention benefits from the uniform characteristic of the analog switches receiving a common current signal, performance of the light emitting display device can be improved.

Example 3

This invention can be applied to various semiconductor apparatuses, and an example of a display panel produced by making use of the embodiments 1 to 5 and examples 1 to 2, will be described. The display panel including a semiconductor device such as a transistor shown in this example may be a liquid crystal-display panel, an EL (Electro Luminescence) display panel, or a display panel for FED (Field Emission Display). Of course, these display panels include components currently available on the market.

A substrate 900 of FIGS. 16A to 16C has a pixel part 902, gate signal side drive circuits 901*a* and 901*b*, a data signal side drive circuit 901*c*, an input-and-output terminal part, and a wiring, or a wiring group 917 formed thereon.

A seal pattern 940 is a pattern for making a sealed space between the opposite substrate 920 and the substrate 900, and in case of a liquid crystal display panel, liquid crystal is enclosed, and in case of an EL panel, EL materials (especially organic electro luminescence materials) are protected from the open air. The seal pattern may overlap with the gate signal side drive circuits 901*a* and 901*b*, data signal side drive circuit 901*c*, the wiring or wiring group 917, which connect the driving circuits and an input terminal. With this arrangement, the area of a frame region (a peripheral region of a pixel part) of the display panel can be reduced. An FPC (flexible printed circuit) 936 is fixed to an external input terminal part.

Furthermore, a chip 950 having various logic circuits, a high frequency circuit, a memory, a microprocessor, a media processor/DSP (Digital Signal Processor), LSI for graphics, Code LSI, and amplifier formed therein may be mounted using transistors obtained with this invention. These functional circuits are formed with a different design rule from the pixel part 902, gate signal side drive circuits 901*a* and 901*b*, data signal side drive circuit 901*c*, and specifically, a design rule of 1 μm or less is applied. Incidentally, it is acceptable to protect the external input terminal part and chip 950 with resin (such as mall resin) 937. Moreover, there is no limitation in the method of mounting, and systems using a TAB tape or a COG (chip-on glass) system can be applied.

For example, the semiconductor integrated circuit of the present invention can be applied as switching elements of the pixel part 902, and also can be applied as active elements constituting the gate signal side drive circuits 901*a* and 901*b*, and data signal side drive circuit 901*c*. Of course, this example represents an example of a display panel obtained by this invention and is not limited to the constitution of FIG. 16.

Example 4

Various electronic apparatuses can be completed by using this invention. As for examples, handheld terminals (electronic notebooks, mobile computers, cellular phones, and the like), video cameras, digital cameras, personal computers, TV sets, cellular phones, and the like are mentioned. Those examples are shown in FIG. 17. In addition, the electronic apparatuses shown here are just examples, therefore the present invention is applicable particularly, but not exclusively, to those examples.

Figure 17A:
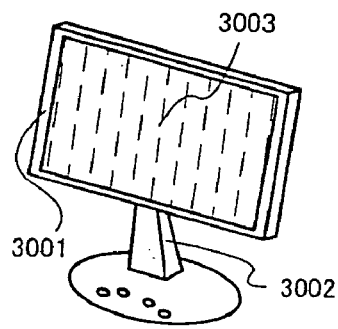
FIGS. 17A to 17G are views showing concrete examples of an electronic apparatus of the invention.

FIG. 17A is an example where a TV set is completed with the application of this invention, which is constituted by a case 3001, a support stand 3002, and a display part 3003. By using the transistors fabricated based on the present invention to integrated circuits, such as a driving circuit of the display part, a memory, other various logical circuits and the like, it becomes possible to form and incorporate the integrated circuits having high efficiency but little variation on glass to thereby constitute a TV set according to this invention.

Figure 17B:
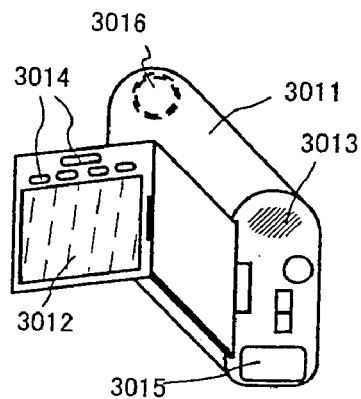

FIG. 17B is an example where a video camera is completed with the application of this invention, which is constituted by a main part 3011, a display part 3012, a voice input part 3013, an operation switch 3014, a battery 3015, and a television part 3016. By using the transistors fabricated based on the present invention to integrated circuits, such as a driving circuit of the display part, a memory, other various logical circuits and the like, it becomes possible to form and incorporate the integrated circuits having high efficiency but little variation on glass to thereby constitute a video camera according to this invention.

Figure 17C:
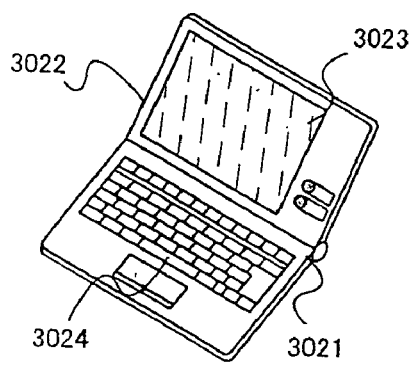

FIG. 17C is an example where a personal computer of a note type is completed with the application of this invention, which is constituted by a main part 3021, a case 3022, a display part 3023, and a keyboard 3024. By using the transistors fabricated based on the present invention to integrated circuits, such as a driving circuit of the display part, a memory, other various logical circuits and the like, it becomes possible to form and incorporate the integrated circuits having high efficiency but little variation on glass to thereby constitute a personal computer according to this invention.

Figure 17D:
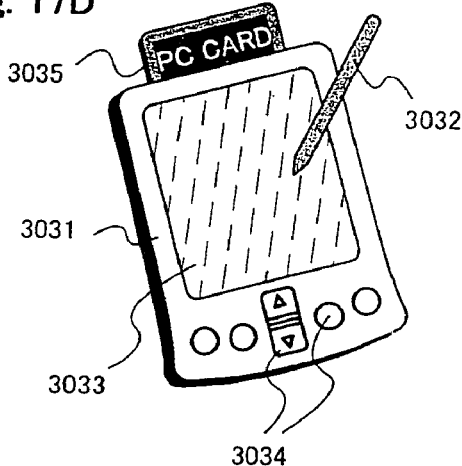

FIG. 17D is an example where PDA is completed (Personal Digital Assistant) with the application of this invention, which is constituted by a main part 3031, a stylus 3032, a display part 3033, an operation button 3034, and an external interface 3035. By using the transistors fabricated based on the present invention to integrated circuits, such as a driving circuit of the display part, a memory, other various logical circuits and the like, it becomes possible to form and incorporate the integrated circuits having high efficiency but little variation on glass to thereby constitute a PDA according to this invention.

Figure 17E:
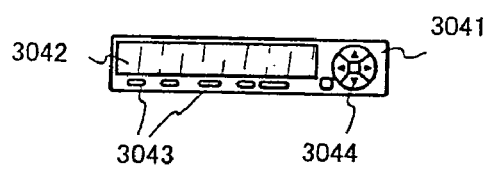

FIG. 17E is an example where a sound playback apparatus such as on-board audio device specifically is completed with the application of this invention, which is constituted by a main part 3041, a display part 3042, operation switches 3043 and 3044. By using the transistors fabricated based on the present invention to integrated circuits, such as a driving circuit of the display part, a memory, other various logical circuits and the like, it becomes possible to form and incorporate the integrated circuits having high efficiency but little variation on glass to thereby constitute an audio apparatus according to this invention.

Figure 17F:
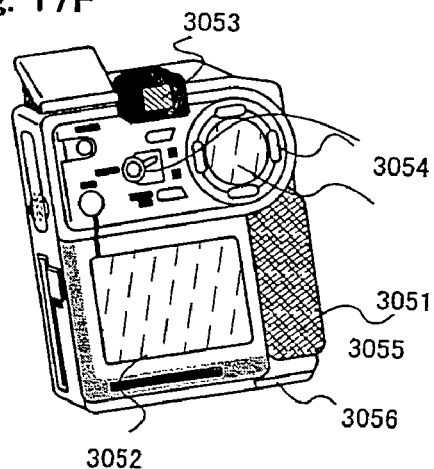

FIG. 17F is an example where a digital camera is completed with the application of this invention, which is constituted by a main part 3051, a display part A 3052, an eyepiece part 3053, an operation switch 3054, a display part B 3055, and a battery 3056. By using the transistors fabricated based on the present invention to integrated circuits, such as a driving circuit of the display part, a memory, other various logical circuits and the like, it becomes possible to form and incorporate the integrated circuits having high efficiency but little variation on glass to thereby constitute a digital camera according to this invention.

Figure 17G:
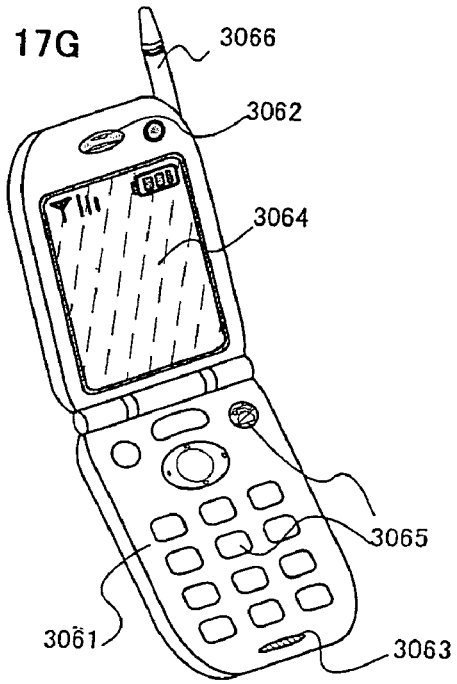

FIG. 17G is an example where a cellular phone is completed, and constituted by a main part 3061, a voice output part 3062, a voice input part 3063, a display part 3064, an operation switch 3065, and an antenna 3066. By using the transistors fabricated based on the present invention to integrated circuits, such as a driving circuit of the display part, a memory, other various logical circuits and the like, it becomes possible to form and incorporate the integrated circuits having high efficiency but little variation on glass to thereby constitute a cellular phone according to this invention.

According to this invention, it is possible to form and obtain channel forming regions from same stripes of crystalline semiconductor films having uniform crystallinity.

Also, according to the invention, it is possible to form a plurality of semiconductor devices which are required to have conformance by using a same stripe of a crystalline semiconductor film having stripes possessing a uniform crystallinity characteristic, and it is possible to provide a semiconductor circuit in which variation between semiconductor devices is small, it is thus possible to provide a semiconductor integrated circuit having high conformance.

Further, the invention can, in a plurality of analog circuits (for example, between analog switch circuits), provide a semiconductor circuit in which variation between the analog switches is small.

Also, the invention, by designating an area in which the channel forming region is formed, enables formation of crystalline semiconductor areas free of crystal grain boundary, and can provide a semiconductor integrated circuit which is formed by a semiconductor device or a group of semiconductor devices which are capable of high speed operations and has high current driving capability.

Finally, reliability of flat panel type display devices represented by a liquid crystal display device and EL (electroluminescence) display device incorporating the semiconductor integrated circuits of the invention can be improved.

What is claimed is:

1. A method of fabricating a semiconductor circuit comprising:
    forming a first insulating film over an insulating surface;
    forming a second insulating film over the first insulating film;
    forming at least first and second projections and a depression therebetween by patterning the second insulating film;
    forming an amorphous semiconductor film over the first and second projections and the depression;
    crystallizing the amorphous semiconductor film to form a crystalline semiconductor film by irradiating laser light to the amorphous semiconductor film; and
    patterning the crystalline semiconductor film to form at least a first channel forming region for a first thin film transistor and a second channel forming region for a second thin film transistor, the first and second channel forming regions being located between the first and the second projections, respectively.

2. A method of fabricating a semiconductor circuit comprising:
    forming a first insulating film on a substrate;
    forming a second insulating film over the first insulating film;
    forming stripe-shaped projections and a stripe-shaped depression by patterning the second insulating film;
    forming an amorphous semiconductor film over the first and second insulating films; and
    forming a crystalline semiconductor film by crystallizing the amorphous semiconductor film;
    patterning the crystalline semiconductor film to form an island-shaped crystalline semiconductor region in the stripe-shaped depression; and
    forming a transistor by using the island-shaped crystalline semiconductor region.

3. A method of fabricating a semiconductor circuit comprising:
    forming a first insulating film on a substrate;
    forming a second insulating film over the first insulating film;
    forming stripe-shaped projections and stripe-shaped depressions by patterning the second insulating film;
    forming an amorphous semiconductor film over the first and second insulating films;
    forming a crystalline semiconductor film by crystallizing the amorphous semiconductor film;
    patterning the crystalline semiconductor film to form an island-shaped crystalline semiconductor region in a plurality of stripe-shaped depressions; and
    forming a transistor by using the island-shaped crystalline semiconductor region.

4. A method of fabricating a semiconductor circuit comprising:
    forming a first insulating film on a substrate;
    forming a second insulating film over the first insulating film;
    patterning the second insulating film to form a first pair of parallel stripe-shaped projections defining a first depression region interposed in between the two stripe-shaped projections of the first pair of parallel stripe-shaped projections, wherein a direction is defined by a long direction of the stripe-shaped projections;
    forming a second pair of parallel stripe-shaped projections defining a second depression region interposed in between the two stripe-shaped projections of the second pair of parallel stripe-shaped projections, wherein a long direction of the stripe-shaped projections of the second pair of parallel stripe-shaped projections is parallel to the direction, and wherein the first depression region and the second depression region are situated on a same line, parallel to the direction;
    forming an amorphous semiconductor film over the first and second insulating films;
    forming a crystalline semiconductor film by crystallizing the amorphous semiconductor film;
    patterning the crystalline semiconductor film to form a first island-shaped crystalline semiconductor region in the first depression region, and a second island-shaped crystalline semiconductor region in the second depression region; and
    forming a first transistor and a second transistor by using the first and second island-shaped crystalline semiconductor regions, respectively.

5. A method of fabricating a semiconductor circuit comprising:
    forming a first insulating film on a substrate;

forming a second insulating film over the first insulating film;

patterning the second insulating film to form parallel stripe-shaped projections, and to define depression regions, wherein each of the depression regions is a space located in between two adjacent stripe-shaped projections;

forming an amorphous semiconductor film over the first and second insulating films;

forming a crystalline semiconductor film by crystallizing the amorphous semiconductor film;

patterning the crystalline semiconductor film to form a first island-shaped crystalline semiconductor region in a first pair of depression regions, and a second island-shaped crystalline semiconductor region in a second pair of depression regions, wherein a first and a second depression regions of the second pair of depression regions are aligned with a first and a second depression regions of the first pair of depression regions according a long direction of the parallel stripe-shaped projections, respectively; and forming a first transistor and a second transistor by using the first and second island-shaped crystalline semiconductor regions, respectively.

6. A method according to claim 4,
further comprising a step of connecting a gate of the first transistor to a gate of the second transistor.

7. A method according to claim 5,
further comprising a step of connecting a gate of the first transistor to a gate of the second transistor.

8. A method according to claim 2,
further comprising a step of thinning the crystalline semiconductor film down to a top level of the stripe-shaped projections.

9. A method according to claim 3,
further comprising a step of thinning the crystalline semiconductor film down to a top level of the stripe-shaped projections.

10. A method according to claim 4,
further comprising a step of thinning the crystalline semiconductor film down to a top level of the parallel stripe-shaped projections.

11. A method according to claim 5,
further comprising a step of thinning the crystalline semiconductor film down to a top level of the parallel stripe-shaped projections.

12. A method according to claim 2,
further comprising a step of removing regions of the crystalline semiconductor film situated above the stripe-shaped projections.

13. A method according to claim 3,
further comprising a step of removing regions of the crystalline semiconductor film situated above the stripe-shaped projections.

14. A method according to claim 4,
further comprising a step of removing regions of the crystalline semiconductor film situated above the parallel stripe-shaped projections.

15. A method according to claim 5,
further comprising a step of removing regions of the crystalline semiconductor film situated above the parallel stripe-shaped projections.

16. A method according to claim 2,
further comprising a step of forming a buffer film over the first and second insulator films, prior to the step of forming the amorphous semiconductor film.

17. A method according to claim 3,
further comprising a step of forming a buffer film over the first and second insulator films, prior to the step of forming the amorphous semiconductor film.

18. A method according to claim 4,
further comprising a step of forming a buffer film over the first and second insulator films, prior to the step of forming the amorphous semiconductor film.

19. A method according to claim 5,
further comprising a step of forming a buffer film over the first and second insulator films, prior to the step of forming the amorphous semiconductor film.

20. A method according to claim 2,
wherein crystallization of the amorphous semiconductor film is carried out by scanning a laser light beam along a long direction of the stripe-shaped projections.

21. A method according to claim 3,
wherein crystallization of the amorphous semiconductor film is carried out by scanning a laser light beam along a long direction of the stripe-shaped projections.

22. A method according to claim 4,
wherein crystallization of the amorphous semiconductor film is carried out by scanning a laser light beam along the direction.

23. A method according to claim 5,
wherein crystallization of the amorphous semiconductor film is carried out by scanning a laser light beam along the long direction of the parallel stripe-shaped projections.

24. A method according to claim 2,
wherein the amorphous semiconductor film is crystallized so as to have a flat surface.

25. A method according to claim 3,
wherein the amorphous semiconductor film is crystallized so as to have a flat surface.

26. A method according to claim 4,
wherein the amorphous semiconductor film is crystallized so as to have a flat surface.

27. A method according to claim 5,
wherein the amorphous semiconductor film is crystallized so as to have a flat surface.

* * * * *